US006599346B2

(12) United States Patent
Goyal et al.

(10) Patent No.: US 6,599,346 B2
(45) **Date of Patent: *Jul. 29, 2003**

(54) BIAXIALLY TEXTURED ARTICLES FORMED BY POWDER METALLURGY

(75) Inventors: Amit Goyal, Knoxville, TN (US); Robert K. Williams, Knoxville, TN (US); Donald M. Kroeger, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 33 days.

This patent is subject to a terminal disclaimer.

(21) Appl. No.: 09/931,433

(22) Filed: Aug. 16, 2001

(65) Prior Publication Data

US 2002/0001711 A1 Jan. 3, 2002

Related U.S. Application Data

(62) Division of application No. 09/570,289, filed on May 15, 2000, now Pat. No. 6,331,199.

(51) Int. Cl.[7] .................................................. C22C 1/04

(52) U.S. Cl. ......................... 75/246; 148/426; 148/427; 148/429

(58) Field of Search ............................ 75/246; 148/426, 148/427, 429

(56) References Cited

U.S. PATENT DOCUMENTS

| | | | | |
|---|---|---|---|---|
| 5,739,086 A | | 4/1998 | Goyal et al. | |
| 5,741,377 A | | 4/1998 | Goyal et al. | |
| 5,898,020 A | | 4/1999 | Goyal et al. | |
| 5,958,599 A | | 9/1999 | Goyal et al. | |
| 5,964,966 A | | 10/1999 | Goyal et al. | |
| 5,968,877 A | | 10/1999 | Budai et al. | |
| 6,331,199 B1 | * | 12/2001 | Goyal | 75/246 |
| 6,458,223 B1 | | 10/2002 | Thieme et al. | |
| 6,475,311 B1 | | 11/2002 | Fritzemeier et al. | |

OTHER PUBLICATIONS

K.Sato, et al., "High–Jc Silver–Sheathed Bi–Based Superconducting Wires," IEEE Transactions on Magnetics, 27 (1991) 1231.

K. Heine, et al., "High–Field Critical Current Densities in BizSr2Ca1Cu2 O8+x/AgWires", Applied Physics Letters, 55(1991) 2441.

R. Flukiger, et al., "High Critical Current Densities in Bi (2223)/Ag tapes," Superconductor Science & Technology 5, (1992) S61.

D. Dimos et al., "Orientation Dependence of Grain–Bounda Critical Currents in $Y_1Ba_2Cu_3O_{7-*}$ Bicrystals", Physical Review Letters, 61 (1988) 219.

D. Dimos et al., "Superconducting Transport Properties of Grain Boundaries in $Y_1Ba_2Cu_3O_7$ Bicrystals", Physical Review B, 41 (1990) 40.

Y. Iijima, et al., "Structural and Transport Properties of Biaxially Aligned $YBa_2Cu_3$ $O_{7-x}$ Films on Polycrystalline Ni–Based Alloy with Ion–Beam Modified Buffer Layers," Journal of Applied Physics, 74(1993) 1905.

R.P. Reade, et al."Laser Deposition of biaxially textured Yttria–Stabilized Zirconia Buffer Layers on Polycrystalline Metallic Alloys for High Critical Current Y–Ba–Cu–O Thin Films", Applied Physics Letters, 61 (1992) 2231.

D. Dijkkamp et al., "Preparation of Y–Ba–Cu–Oxide Superconducting Thin Films Using Pulsed Laser Evaporation from High Tc Bulk Material," Applied Physics Letters, 51, 619 (198.

S. Mahajan et al., "Effects of Target and Template Layer on the Properties of Highly Crystalline Superconducting a–Axis Films of $YBa_2$ $Cu_3$ $O_{7-x}$ by DC–Sputtering," Physica C, 213, 445 (1993).

A. Inam et al., "A–axis Oriented Epitaxial $YBa_2$ $Cu_3$ $O_{7-x}$ $PrBa_2Cu_3O_{7-x}$ Heterostructures," Applied Physics Letters 57, 2484 (1990).

R.E. Russo et al., "Metal Buffer Layers and Y–Ba–Cu–O Thin Films on Pt and Stainless Steel Using Pulsed Laser Deposition," Journal of Applied Physics, 68, 1354 (1990).

E. Narumi et al., "Superconducting $YBa_2$ $Cu_3$ $O_{6.8}$ Films on Metallic Substrates Using In Situ Laser Deposition," Applied Physics Letters, 56, 2684 (1990).

R.P. Reade et al., "Laser Deposition of Biaxially Textured Yttria–Stabilized Zirconia Buffer Layers on Polycrystalline Metallic Alloys for High Critical Current Y–Ba–Cu–O Thin Films," Applied Physics Letters, 61, 2231, (1992).

J.D. Budai et al., "In–Plane Epitaxial Alignment of $YBa_2$ $Cu_3$ $O_{7-x}$ Films Grown on Silver Crystals and Buffer Layers," Applied Physics Letters, 62, 1836, (1993).

T.J. Doi et al., "A New Type of Superconducting Wire; Biaxially Oriented TI, $(Ba_{0.8}Sr_{0.2})_2$ $Ca_2$ $Cu_3$ $O_9$ on {100} <100> Textured Silver Tape," Proceedings of 7th International Symposium on Superconductivity, Fukuoka.

D. Forbes, Executive Editor, " Hitachi Reports 1–meter T1–1223 Tape Made by Spray Pyrolysis," Superconductor Week, vol. 9, No. 8, Mar. 6, 1995.

Recrystallization, Grain Growth and Textures, Papers presented at a Seminar of the American Society for Metals, Oct. 16, and 17, 1965, American Society for Metals, Metals Park, Ohio.

* cited by examiner

*Primary Examiner*—Ngoclan Mai
(74) *Attorney, Agent, or Firm*—Joseph A. Marasco; L. Kenneth Davis

(57) ABSTRACT

A biaxially textured alloy article having a magnetism less than pure Ni includes a rolled and annealed compacted and sintered powder-metallurgy preform article, the preform article having been formed from a powder mixture selected from the group of mixtures consisting of: at least 60 at % Ni powder and at least one of Cr powder, W powder, V powder, Mo powder, Cu powder, Al powder, Ce powder, YSZ powder, Y powder, Mg powder, and RE powder; the article having a fine and homogeneous grain structure; and having a dominant cube oriented {100}<100> orientation texture; and further having a Curie temperature less than that of pure Ni.

4 Claims, 36 Drawing Sheets

Ni-9at%W alloy
Annealing Temperature = 1200°C

Ni-9at%W alloy
Annealing Temperature = 1200°C

Ni-9at%W alloy
Annealing Temperature = 1200°C

Ni-9at%W alloy
Annealing Temperature = 1200°C

Ni-9at%W alloy
Annealing Temperature = 1400°C

Ni-9at%W alloy
Annealing Temperature = 1400°C

Ni-9at%W alloy
Annealing Temperature = 1400°C

Ni-9at%W alloy
Annealing Temperature = 1400°C

Ni-13at%Cr alloy
Annealing Temperature = 1200°C

Ni-13at%Cr alloy
Annealing Temperature = 1200°C

Ni-13at%Cr alloy
Annealing Temperature = 1200°C

Ni-13at%Cr alloy
Annealing Temperature = 1200°C

Ni-13at%Cr alloy
Annealing Temperature = 1400°C

Ni-13at%Cr alloy
Annealing Temperature = 1400°C

Ni-13at%Cr alloy
Annealing Temperature = 1400°C

Ni-13at%Cr alloy
Annealing Temperature = 1400°C

Ni-0.03at%Mg alloy
Annealing Temperature = 1200°C

Ni-0.03at%Mg alloy
Annealing Temperature = 1200°C

Ni-0.03at%Mg alloy
Annealing Temperature = 1200°C

Ni-0.03at%Mg alloy
Annealing Temperature = 1200°C

Ni-9at%W-0.03at%Mg alloy
Annealing Temperature = 1200°C

Ni-9at%W-0.03at%Mg alloy
Annealing Temperature = 1200°C

Ni-9at%W-0.03at%Mg alloy
Annealing Temperature = 1200°C

Ni-9at%W-0.03at%Mg alloy
Annealing Temperature = 1200°C

Ni-9at%W-0.03at%Mg alloy
Annealing Temperature = 1400°C

Ni-9at%W-0.03at%Mg alloy
Annealing Temperature = 1400°C

Ni-9at%W-0.03at%Mg alloy
Annealing Temperature = 1400°C

Ni-9at%W-0.03at%Mg alloy
Annealing Temperature = 1400°C

Ni-13at%Cr-0.03at%Mg alloy
Annealing Temperature = 1200°C

Ni-13at%Cr-0.03at%Mg alloy
Annealing Temperature = 1200°C

Ni-13at%Cr-0.03at%Mg alloy
Annealing Temperature = 1200°C

Ni-13at%Cr-0.03at%Mg alloy
Annealing Temperature = 1200°C

Ni-13at%Cr-0.03at%Mg alloy
Annealing Temperature = 1400°C

Ni-13at%Cr-0.03at%Mg alloy
Annealing Temperature = 1400°C

Ni-13at%Cr-0.03at%Mg alloy
Annealing Temperature = 1400°C

Ni-13at%Cr-0.03at%Mg alloy
Annealing Temperature = 1400°C

BIAXIALLY TEXTURED ARTICLES FORMED BY POWDER METALLURGY

CROSS-REFERENCE TO RELATED APPLICATIONS

This application is a divisional application of U.S. patent application Ser. No. 09/570,289 filed on May 15, 2000, entitled "Biaxially Textured Articles Formed by Powder Metallurgy" and issued as U.S. Pat. No. 6,331,199 on Dec. 18, 2001, the entire disclosure of which is incorporated herein by reference.

The following relate to the present invention and are hereby incorporated by reference: U.S. Patent Application Method for Forming Biaxially Textured Articles by Powder Metallurgy by Goyal, tiled on even date herewith; U.S. Pat. No. 5,739,086 Structures Having Enhanced Biaxial Texture and Method of Fabricating Same by Goyal et al., issued Apr. 14, 1998; U.S. Pat. No. 5,741,377 Structures Having Enhanced Biaxial Texture and Method of Fabricating Sane by Goyal et al., issued Apr. 21, 1998; U.S. Pat. No. 5,898,020 Structures Having biaxial Texture and Method of Fabricating Same by Goyal et al., issued Apr. 27, 1999; U.S. Pat. No. 5,958,599 Structures Having Enhanced Biaxial Texture by Goyal et al., issued Sep. 28, 1999, U.S. Pat. No. 5,964,966 Method of Forming Biaxially Textured Substrates and Devices Thereon by Goyal et al., issued Oct. 21, 1999; and U.S. Pat. No. 5,968,877 High Tc YBCO Superconductor Deposited on Biaxially Textured Ni Substrate by Budai et al., issued Oct. 19, 1999.

This invention was made with Government support under Contract No. DE-AC05-96OR22464 awarded by the United States Department of Energy. The Government has certain rights in this invention.

FIELD OF THE INVENTION

The present invention relates to biaxially textured metallic substrates and articles made therefrom, and more particularly to such substrates and articles made from high purity face-centered cubic (FCC) materials using powder metallurgy techniques to form long lengths of biaxially textured sheets, and more particularly to the use of said biaxially textured sheets as templates to grow epitaxial metal/alloy/ceramic layers.

BACKGROUND OF THE INVENTION

Current materials research aimed at fabricating high-temperature superconducting ceramics in conductor configurations for bulk, practical applications, is largely focused on powder-in-tube methods. Such methods have proved quite successful for the Bi—(Pb)—Sr—Ca—Cu—O (BSCCO) family of superconductors due to their unique mica-like mechanical deformation characteristics. In high magnetic fields, this family of superconductors is generally limited to applications below 30K. In the Re—Ba—Cu—O (ReBCO, Re denotes a rare earth element), Tl—(Pb,Bi)—Sr—(Ba)—Ca—Cu—O and Hg—(Pb)—Sr—(Ba)—Ca—Cu—O families of superconductors, some of the compounds have much higher intrinsic limits and can be used at higher temperatures.

It has been demonstrated that these superconductors possess high critical current densities ($J_c$) at high temperatures when fabricated as single crystals or in essentially single-crystal form as epitaxial films on single crystal substrates Such as $SrTiO_3$ and $LaAlO_3$. These superconductors have so far proven intractable to conventional ceramics and materials processing techniques to form long lengths of conductor with $J_c$ comparable to epitaxial films. This is primarily because of the "weak-link" effect.

It has been demonstrated that in ReBCO, biaxial texture is necessary to obtain high transport critical current densities. High $J_c$'s have been reported in polycrystalline ReBCO in thin films deposited on special substrates on which a biaxially textured non-superconducting oxide buffer layer is first deposited using ion-beam assisted deposition (IBAD) techniques. IBAD is a slow, expensive process, and difficult to scale up for production of lengths adequate for many applications.

High $J_c$'s have also been reported in polycrystalline ReBCO melt-processed bulk material which contains primarily small angle grain boundaries. Melt processing is also considered too slow for production of practical lengths.

Thin-film materials having perovskite-like structures are important in superconductivity, ferroelectrics, and electro-optics. Many applications using these materials require, or would be significantly improved by, single crystal, c-axis oriented perovskite-like films grown on single-crystal or highly aligned metal or metal-coated substrates.

For instance, Y—$Ba_2$—$Cu_3$—$O_N$ (YBCO) is an important superconducting material for the development of superconducting current leads, transmission lines, motor and magnetic windings, and other electrical conductor applications. When cooled below their transition temperature, superconducting materials have no electrical resistance and carry electrical current without heating up. One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents and remain superconducting, however, the YBCO films must be biaxially textured, preferably c-axis oriented, with essentially no large-angle grain boundaries, since such grain boundaries are detrimental to the current-carrying capability of the material. YBCO films deposited on polycrystalline metal substrates do not generally meet this criterion.

The present invention provides a method for fabricating biaxially textured sheets of alloy substrates with desirable compositions. This provides for applications involving epitaxial devices on such alloy substrates. The alloys can be thermal expansion and lattice parameter matched by selecting appropriate compositions. They can then be processed according to the present invention, resulting in devices with high quality films with good epitaxy and minimal microcracking.

The terms "process", "method", and "technique" are used interchangeably herein.

For further information, refer to the following publications:

1. K. Sato, et al., "High-$J_c$ Silver-Sheathed Bi-Based Superconducting Wires", *IEEE Transactions on Magnetics*, 27 (1991)1231.
2. K. Heine, et al., "High-Field Critical Current Densities in $Bi_2Sr_2Ca_1Cu_2O_{8+x}$/Ag Wires", *Applied Physics Letters*, 55 (1991) 2441.
3. R. Flukiger, et al., "High Critical Current Densities in Bi(2223)/Ag tapes", *Superconductor Science & Technology* 5, (1992)S61.
4. D. Dimos et al., "Orientation Dependence of Grain-Boundary Critical Currents in $Y_1Ba_2Cu_3O_{7-x}$ Bicrystals", *Physical Review Letters*, 61 (1988) 219.
5. D. Dimos et al., "Superconducting Transport Properties of Grain Boundaries in $Y_1Ba_2Cu_3O_7$ Bicrystals", *Physical Review B*, 41 (1990) 4038.

6. Y. Iijima, et al., "Structural and Transport Properties of Biaxially Aligned $YBa_2Cu_3O_{7-x}$ Films on Polycrystalline Ni-Based Alloy with Ion-Bean Modified Buffer Layers", *Journal of Applied Physics*, 74 (1993) 1905.

7. R. P. Reade, et al. "Laser Deposition of biaxially textured Yttria-Stabilized Zirconia Buffer Layers on Polycrystalline Metallic Alloys for High Critical Current Y—Ba—Cu—O Thin Films", *Applied Physics Letters*, 61 (1992) 2231.

8. D. Dijkkamp et al., "Preparation of Y—Ba—Cu Oxide Superconducting Thin Films Using Pulsed Laser Evaporation from High Tc Bulk Material," *Applied Physics Letters*, 51, 619 (1987).

9. S. Mahajan et al., "Effects of Target and Template Layer on the Properties of Highly Crystalline Superconducting a-Axis Films of $YBa_2CuO_{7-x}$ by DC-Sputtering," *Physica C*, 213, 445 (1993).

10. A. Inam et al., "A-axis Oriented Epitaxial $YBa_2Cu_3O_{7-x}$—$PrBa_2Cu_3O_{7-x}$ Heterostructures," *Applied Physics Letters*, 57, 2484 (1990).

11. R. E. Russo et al., "Metal Buffer Layers and Y—Ba—Cu—O Thin Films on Pt and Stainless Steel Using Pulsed Laser Deposition," *Journal of Applied Physics*, 68, 1354 (1990).

12. E. Narumi et al., "Superconducting $YBa_2Cu_3O_{6.8}$ Films on Metallic Substrates Using In Situ Laser Deposition," *Applied Physics Letters*, 56, 2684 (1990).

13. R. P. Reade et al., "Laser Deposition of Biaxially Textured Yttria-Stabilized Zirconia Buffer Layers on Polycrystalline Metallic Alloys for High Critical Current Y—Ba—Cu—O Thin Films," *Applied Physics Letters*, 61, 2231 (1992).

14. J. D. Budai et al., "In-Plane Epitaxial Alignment of $YBa_2Cu_3O_{7-x}$ Films Grown on Silver Crystals and Buffer Layers," *Applied Physics Letters*, 62, 1836 (1993).

15. T. J. Doi et al., "A New Type of Superconducting Wire, Biaxially Oriented $Tl_1(Ba_{0.8}Sr_{0.2})_2Ca_2Cu_3O_9$ on {100}<100> Textured Silver Tape," *Proceedings of 7th International Symposium on Superconductivity,* Fukuoka, Japan, Nov. 8–11, 1994.

16. D. Forbes, Executive Editor, "Hitachi Reports 1-meter Tl-1223 Tape Made by Spray Pyrolysis", *Superconductor Week*, Vol. 9, No. 8, Mar. 6, 1995.

17. *Recrystallization, Grain Growth and Textures*, Papers presented at a Seminar of the American Society for Metals, Oct. 16 and 17, 1965, American Society for Metals, Metals Park, Ohio.

OBJECTS OF THE INVENTION

Accordingly, it is an object of the present invention to provide new and useful biaxially textured metallic substrates and articles made therefrom.

It is another object of the present invention to provide such biaxially textured metallic substrates and articles made therefrom by rolling and recrystallizing high purity face-centered cubic materials to form long lengths of biaxially textured sheets.

It is yet another object of the present invention to provide for the use of said biaxially textured sheets as templates to grow epitaxial metal/alloy/ceramic layers.

Further and other objects of the present invention will become apparent from the description contained herein.

SUMMARY OF THE INVENTION

In accordance with one aspect of the present invention, the foregoing and other objects are achieved by a biaxially textured alloy article having a magnetism less than pure Ni which comprises a rolled and annealed compacted and sintered powder-metallurgy preform article, the preform article having been formed from a powder mixture selected from the group of binary mixtures consisting of between 99 at % and 80 at % Ni powder and between 1 at % and 20 at % Cr powder; between 99 at % and 80 at % Ni powder and between 1 at % and 20 at % W powder; between 99 at % and 80 at % Ni powder and between 1 at % and 20 at % V powder; between 99 at % and 80 at % Ni powder and between 1 at % and 20 at % Mo powder; between 99 at % and 60 at % Ni powder and between 1 at % and 40 at % Cu powder; between 99 at % and 80 at % Ni powder and between 1 at % and 20 at % Al powder; the article having a fine and homogeneous grain structure; and having a dominant cube oriented {100}<100> orientation texture; and further having a Curie temperature less than that of pure Ni.

In accordance with a second aspect of the present invention, the foregoing and other objects are achieved by a biaxially textured alloy article having a magnetism less than pure Ni which comprises a rolled and annealed compacted and sintered powder-metallurgy preform article, the preform article having been formed from a powder mixture selected from the group of ternary mixtures consisting of: Ni powder, Cu powder, and Al powder; Ni powder, Cr powder, and Al powder; Ni powder, W powder and Al powder; Ni powder, V powder, and Al powder; Ni powder, Mo powder, and Al powder; the article having a fine and homogeneous grain structure; and having a dominant cube oriented {100}<100> orientation texture; and further having a Curie temperature less than that of pure Ni.

In accordance with a third aspect of the present invention, the foregoing and other objects are achieved by a biaxially textured alloy article alloy article having a magnetism less than pure Ni which comprises a rolled and annealed compacted and sintered powder-metallurgy preform article, the preform article having been formed from a powder mixture selected selected from the group of mixtures consisting of at least 60 at % Ni powder and at least one of Cr powder, W powder, V powder, Mo powder, Cu powder, Al powder, Ce powder, YSZ powder, Y powder, and RE powder, the article having a fine and homogeneous grain structure; and having a dominant cube oriented {100}<100> orientation texture; and further having a Curie temperature less than that of pure Ni.

In accordance with a fourth aspect of the present invention, the foregoing and other objects are achieved by a strengthened, biaxially textured alloy article having a magnetism less than pure Ni which comprises a rolled and annealed, compacted and sintered powder-metallurgy preform article, the preform article having been formed from a powder mixture selected from the group of mixtures consisting of: Ni, Ag, Ag—Cu, Ag—Pd, Ni—Cu, Ni—V, Ni—Mo, Ni—Al, Ni—Cr—Al, Ni—W—Al, Ni—V—Al, Ni—Mo—Al, Ni—Cu—Al; and at least one fine powder such as but not limited to $Al_2O_3$, MgO, YSZ, $CeO_2$, $Y_2O_3$, and YSZ; the article having a grain size which is fine and homogeneous and further having a dominінant cube oriented {100}<100> orientation texture; and further having a Curie temperature less than that of pure Ni.

DETAILED DESCRIPTION OF THE INVENTION

Figure 1:
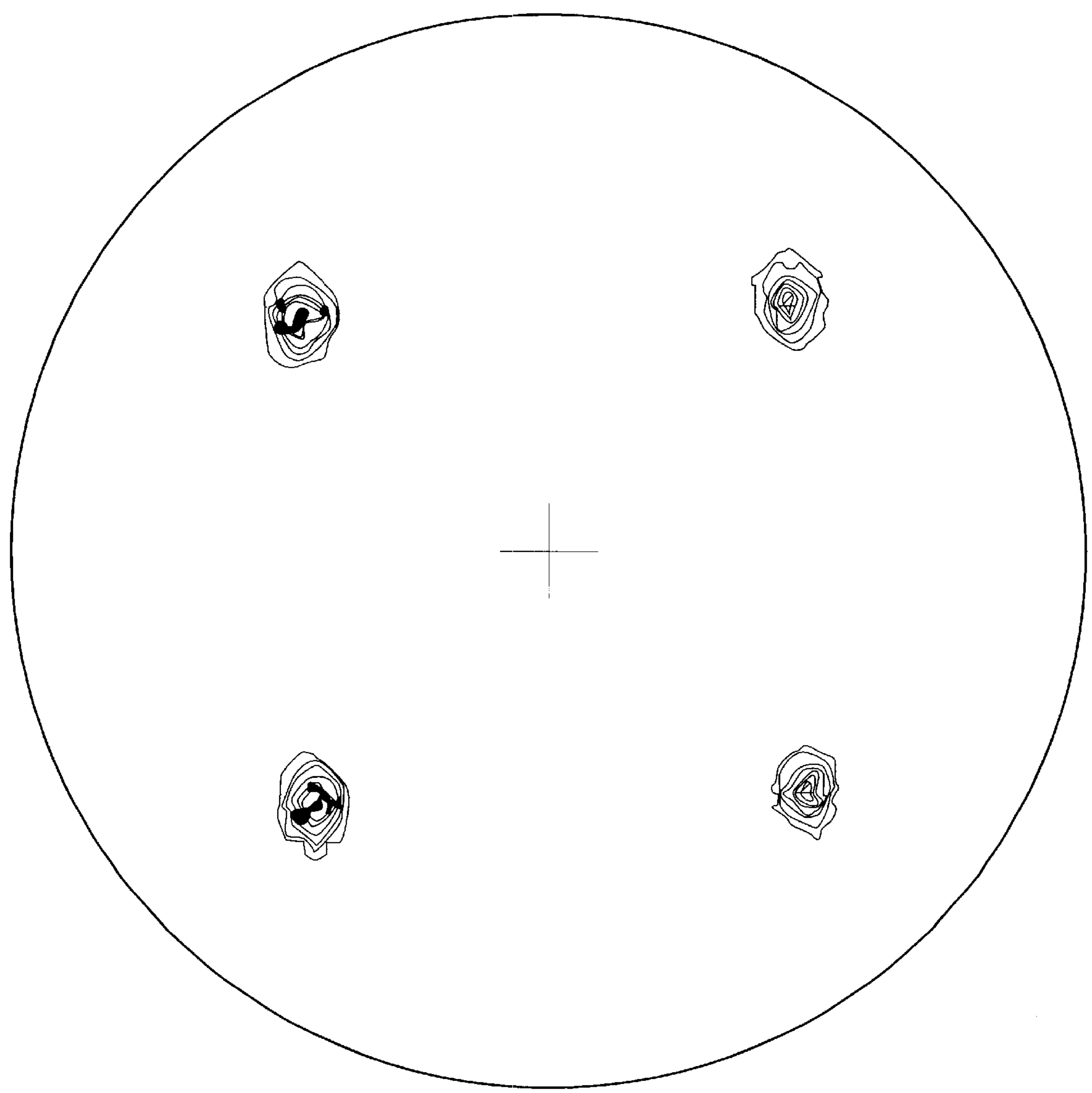
FIG. 1 shows a (111) pole figure for a Ni-9 at %W alloy fabricated by rolling and annealing a compacted and sintered, powder metallurgy preform. The pole figure indicates only four peaks consistent with only a well-developed {100}<100>, biaxial cube texture. The final annealing temperature of the sample was 1200° C.

Note: As used herein, percentages of components in compositions are atomic percent unless otherwise specified.

A new method for producing highly textured alloys has been developed. It is well established in the art that high purity FCC metals can be biaxially textured under certain conditions of plastic deformation, such as rolling, and subsequent recrystallization. For example, a sharp cube texture can be attained by deforming Cu by large amounts (90%) followed by recrystallization. However, this is possible only in high purity Cu. Even small amounts of impurity elements (i.e., 0.0025% P, 0.3% Sb, 0.18% Cd, 0.47% As, 1% Sn, 0.5% Be etc.) can significantly modify the deformation behavior and hence the kind and amount of texture that develops on deformation and recrystallization. In this invention, a method is described to texture alloys of cubic materials, in particular FCC metal based alloys. Alloys and composite compositions resulting in desirable physical properties can be processed to form long lengths of biaxially textured sheets. Such sheets can then be used as templates to grow epitaxial metal/alloy/ceramic layers for a variety of applications.

The present invention has application especially in the making of strengthened substrates with magnetism less than that of pure Ni. For a substance to have less magnetism than pure Ni implies that its Curie temperature is less than that of pure Ni. Curie temperature is known in the art as the temperature at which a metal becomes magnetic. In the following description, a material having less magnetism than that of pure Ni implies a material having a Curie temperature at least 50° C. less than that of pure Ni.

Many device applications require good control of the grain boundary of the materials comprising the device. For example in high temperature superconductors grain boundary character is very important. The effects of grain boundary characteristics on current transmission across the boundary have been very clearly demonstrated for Y123. For clean, stochiometric boundaries, $J_c$(gb), the grain boundary critical current, appears to be determined primarily by the grain boundary misorientation. The dependence of $J_c$(gb) on misorientation angle has been determined by Dimos et al. [1] in Y123 for grain boundary types which can be formed in epitaxial films on bicrystal substrates. These include [001] tilt, [100] tilt, and [100] twist boundaries [1]. In each case high angle boundaries were found to be weak-linked. The low $J_c$ observed in randomly oriented polycrystalline Y123 can be understood on the basis that the population of low angle boundaries is small and that frequent high angle boundaries impede long-range current flow. Recently, the Dimos experiment has been extended to artificially fabricated [001] tilt bicrystals in $Tl_2Ba_2CaCu_2O_N$ [2], $Tl_2Ba_2Ca_2Cu_3O_N$ [3], $TlBa_2Ca_2Cu_2O_N$, [4], and $Nd_{1.85}Ce_{0.15}CuO_4$ [3]. In each case it was found that, as in Y123, $J_c$ depends strongly on grain boundary misalignment angle. Although no measurements have been made on Bi-2223, data on current transmission across artificially fabricated grain boundaries in Bi-2212 indicate that most large angle [001] tilt [3] and twist [5,6] boundaries are weak links, with the exception of some coincident site lattice (CSL) related boundaries [5,6]. It is likely that the variation in $J_c$ with grain boundary misorientation in Bi-2212 and Bi-2223 is similar to that observed in the well-characterized cases of Y123 and Tl-based superconductors. Hence in order to fabricate high temperature superconductors with very critical current densities, it is necessary to biaxially align essentially all the grains. This has been shown to result in significant improvement in the superconducting properties of YBCO films [7–10].

A method for producing biaxially textured substrates was taught in previous U.S. Pat. Nos. 5,739,086, 5,741,377, 5,898,020, and 5,958,599. That method relies on the ability to texture metals, in particular FCC metals such as copper, to produce a sharp cube texture followed by epitaxial growth of additional metal/ceramic layers. Epitaxial YBCO films grown on such substrates resulted in high $J_c$. However, in order to realize any applications, one of the areas requiring significant improvement and modification is the nature of the substrate. The preferred substrate was made by starting with high purity Ni, which is first thermomechanically biaxially textured, followed by epitaxial deposition of metal and/or ceramic layers. Because Ni is ferromagnetic, the substrate as a whole is magnetic and this causes difficulty in practical applications involving superconductors. A second problem is the thermal expansion mismatch between the preferred substrate and the oxide layers. The thermal expansion of the substrate is dominated by that of Ni which is quite different from most desired ceramic layers for practical applications. This mismatch can result in cracking and may limit properties. A third problem is the limitation of the lattice parameter to that of Ni alone. If the lattice parameter can be modified to be closer to that of the ceramic layers, epitaxy can be obtained far more easily with reduced internal stresses. This can reduce or prevent cracking and other stress-related defects and effects (e.g. delamination) in the ceramic films.

Although a method to form alloys starting from the textured Ni substrate is also suggested in U.S. Pat. Nos. 5,739,086, 5,741,377, 5,898,020, and 5,958,599, its scope is limited in terms of the kinds of alloys that can be fabricated. This is because only a limited set of elements can be homogeneously diffused into the textured Ni substrate. A method for fabricating textured alloys was proposed in another previous invention U.S. Pat. No. 5,964,966. The invention involved the use of alloys of cubic metals such as Cu, Ni, Fe, Al and Ag for making biaxially textured sheets such that the stacking fault frequency, $\nu$, of the alloy with all the alloying additions is less than 0.009. In case it is not possible to make an alloy with desired properties to have the stacking fault frequency less than 0.009 at room temperature, then deformation can be carried out at higher temperatures where the ν is less than 0.009. However, that invention may be limited in the sharpness of the texture which can be attained. This is because no specific control on the starting material to fabricate the biaxially textured alloys was given which results in a sharp biaxial texture. Moreover, the alloys fabricated using the methods described in the invention, result in materials which have secondary recrystallization temperatures less than 1200° C. Once the secondary recrystallization temperature is reached, the substrate essentially begins to lose all its cube texture. Low secondary recrystallization temperatures limit the sharpness of biaxial texture that can be obtained and what deposition temperatures can be used for depositing epitaxial oxide or other layers on such substrates.

Furthermore, the invention does not teach how one could potentially texture and effectively use an alloy with compositions such that the stacking fault frequency of the alloy is greater than 0.009 at room temperature. Lastly, the invention does not provide a method or describe an article which effectively incorporates ceramic constituents in the alloy body to result in very significant mechanical toughening, yet maintaining the strong biaxial texture.

A metallic object such as a metal tape is defined as having a cube texture when the {100} crystallographic planes of the metal are aligned parallel to the surface of the tape and the [100] crystallographic direction is aligned along the length of the tape. The cube texture is referred to as the {100}<100> texture.

Here, a new method for fabricating strongly or dominantly cube textured surfaces of composites which have tailored bulk properties (i.e. thermal expansion, mechanical properties, non-magnetic nature, etc.) for the application in question, and which have a strongly textured surface that is compatible with respect to lattice parameter and chemical reactivity with the layers of the electronic device(s) in question, is described. Herein the term dominantly or strongly cube tetured surface describes one that has 95% of the grains comprising the surface in the {100}<100> orientation.

The method for fabricating biaxially textured alloys of the herein disclosed and claimed invention utilizes powder metallurgy technology. Powder metallurgy allows fabrication of alloys with homogeneous compositions everywhere without the detrimental effects of compositional segregation commonly encountered when using vacuum melting or casting to make alloys. Furthermore, powder metallurgy allows easy control of the grain size of the starting alloy body. Moreover, powder metallurgy allows a fine and homogeneous grain size to be achieved. Herein, fine grain size means grain size less than 200 microns. Homogeneous grain size means variation in grain size of less than 40%. In the following we break the discussion into three parts:

Procedures and examples to obtain biaxially textured alloys which have stacking fault frequencies less than 0.009 at room temperature, but have better biaxial textures and have higher secondary recrystallization temperatures.

Procedures and examples to obtain biaxially textured alloys with a distribution of ceramic particles for mechanical strengthening.

Procedures and examples to obtain and effectively use biaxially textured alloys which have stacking fault frequencies greater than 0.009 at room temperature.

PROCEDURES AND EXAMPLES TO OBTAIN BIAXIALLY TEXTURED ALLOYS WHICH HAVE STACKING FREQUENCIES LESS THAN 0.009 AT ROOM TEMPERATURE, BUT HAVE BETTER BIAXIAL TEXTURES AND HAVE HIGHER SECONDARY RECRYSTALLIZATION TEMPERATURES

The basic premise or idea here is that alloys are formed by starting with high purity powders of the alloy constituents, mechanically mixing them together to form a homogeneous mixture, compacting and heat-treating the resulting body to form a raw article or starting preform. The thermomechanical treatment results in a fine and homegeneous grain size in the initial starting preform.

Example I

Begin with a mixture of 80% Ni powder (99.99% purity) and 9% W powder. Mix and compact at appropriate pressures into a rod or billet. Then heat treat at 900° C. for 2 hr. The grain size at the end of heat treatment is less than 50 $\mu$m. Deform, by rolling, to a degree greater than 90% total deformation, preferably using 10% reduction per pass and by reversing the rolling direction during each subsequent pass. Anneal at about 1200° C. for about 60 minutes to produce a sharp biaxial texture. Annealing is performed in flowing 4% $H_2$ in Ar.

Figure 2:
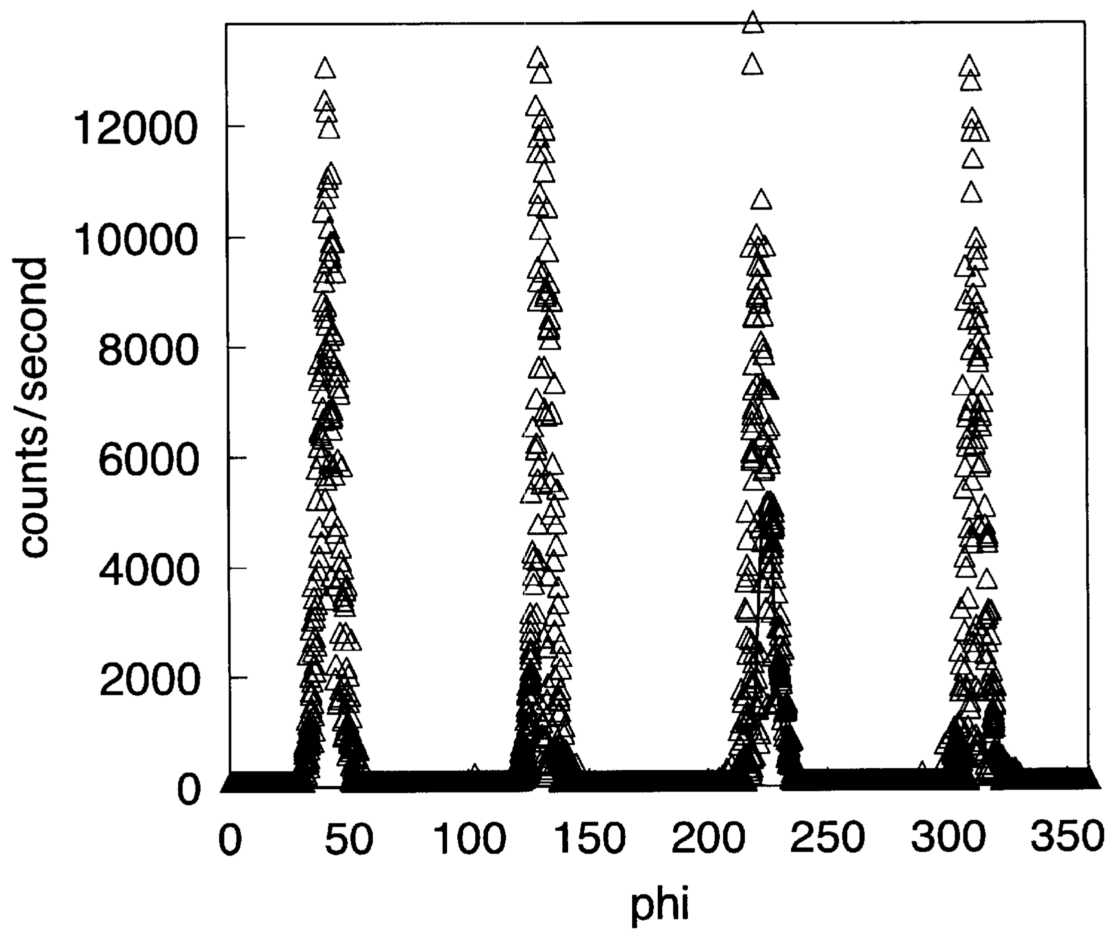
FIG. 2 shows a phi (ϕ) scan of the [111] reflection, with ϕ varying from 0° to 360°, for a Ni-9 at %W alloy fabricated by rolling and annealing a compacted and sintered, powder metallurgy preform. The presence of four peaks is with only a well-developed {100}<100>, biaxial cube texture is apparent. The final annealing temperature of the sample was 1200° C. The FWHM of the ϕ-scan, as determined by fitting a gaussian curve to one of the peaks is ~8.8°. The FWHM of the peaks in this scan is indicative of the in-plane texture of the grains in the sample.
Figure 3:
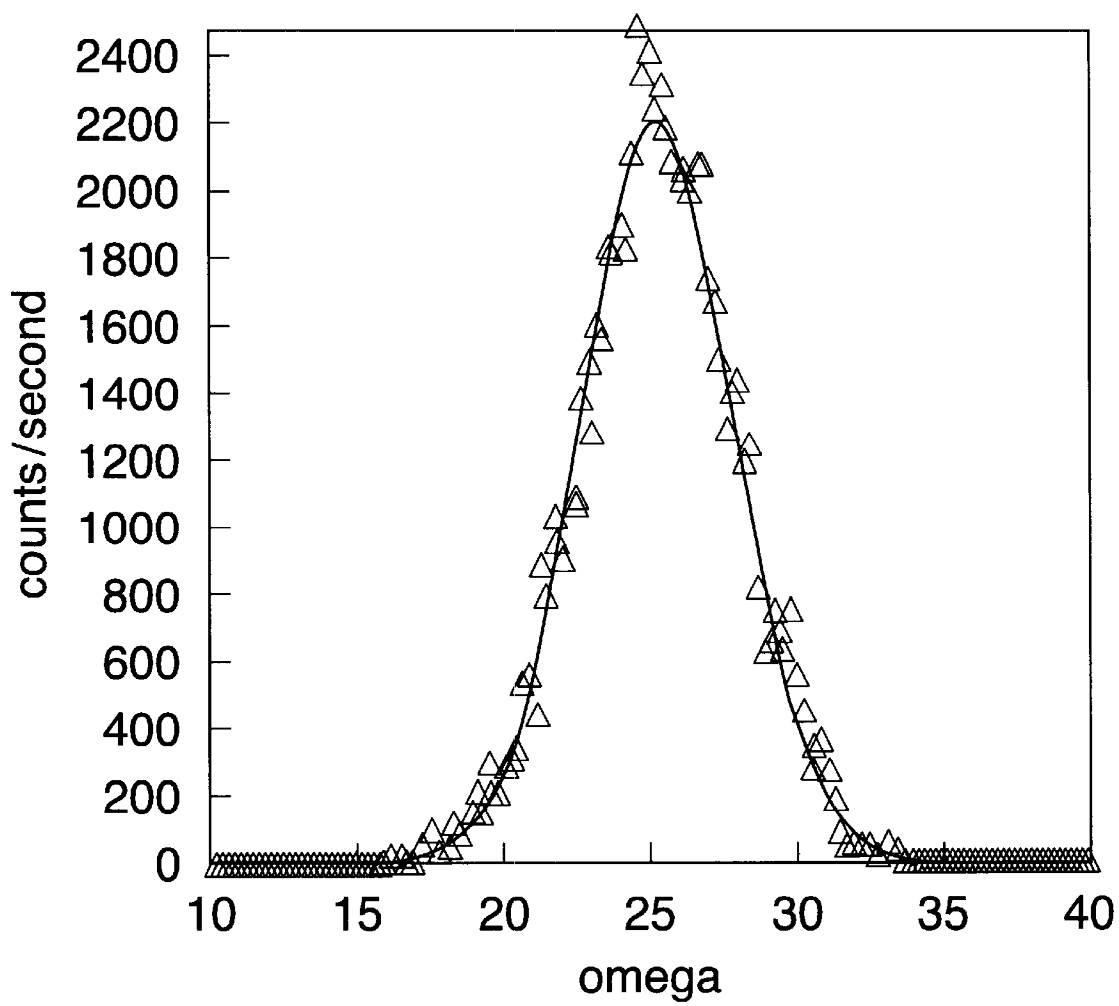
FIG. 3 shows a rocking curve (ω-scan) from 10° to 40° with the sample being rocked in the rolling direction, for a Ni-9 at %W alloy fabricated by rolling and annealing a compacted and sintered, powder metallurgy preform. The final annealing temperature of the sample was 1200° C. The peak is indicative of the out-of-plane texture of the sample. The FWHM of the ω-scan, as determined by fitting a gaussian curve to one of the peaks is ~6.1°.
Figure 4:
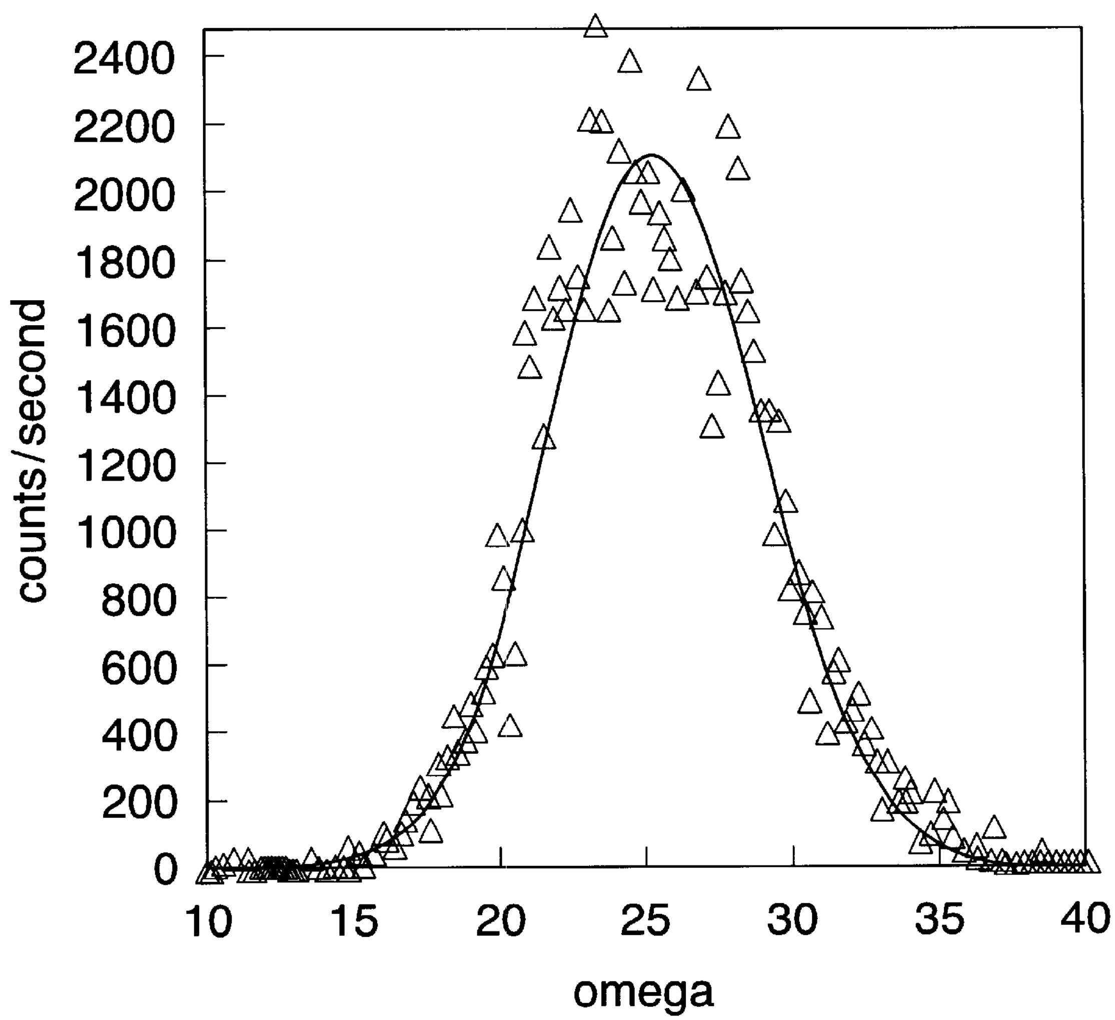
FIG. 4 shows a rocking curve (ω-scan) from 10° to 40° with the sample being rocked about the rolling direction, for a Ni-9 at %W alloy fabricated by rolling and annealing a compacted and sintered, powder metallurgy preform. The final annealing temperature of the sample was 1200° C. The peak is indicative of the out-of-plane texture of the sample. The FWHM of the ω-scan, as determined by fitting a gaussian curve to one of the peaks is ~8.5°.

FIG. 1 shows a (111) X-ray diffraction pole figure of the biaxially textured alloy substrate. As can be seen, only four-peaks are evident. Each peak refers to one of four crystallographically similar orientations corresponding to {100}<100>, such that the (100) plane is parallel to the surface of the tape and <100> direction is aligned along the long axis of the tape. FIG. 2 shows a phi-scan of the [111] reflection showing the degree of in-plane texture. The FWHM of the tape is determined by fitting a gaussian curve to the data is ~8.8°. FIG. 3 shows the rocking curve or the out-of-plane texture as measured by scanning the [200] reflection of the substrate. FIG. 3 is a rocking curve with the sample being rocked in the rolling direction and shows a FWHM of 6.14°. FIG. 4 is a rocking curve with the sample being rocked about the rolling direction and shows a FWHM of 8.49°. This is truly a single orientation texture with all crystallographic axis being aligned in all direction within 8–9°. Alloys made by procedures other than what is described above result in secondary recrystallization at about 1200° C.

Example II

Begin with a mixture of 80% Ni powder (99.99% purity) and 9% W powder. Mix and compact at appropriate pressures into a rod or billet. Then heat treat at 900° C. for 2 hr. The grain size at the end of heat treatment is less than 50 $\mu$m. Deform, by rolling, to a degree greater than 90% total deformation, preferably using 10% reduction per pass and by reversing the rolling direction during each subsequent pass. Anneal at about 1400° C. for about 60 minutes to produce a sharp biaxial texture. Annealing is performed in flowing 4% $H_2$ in Ar.

Figure 5:
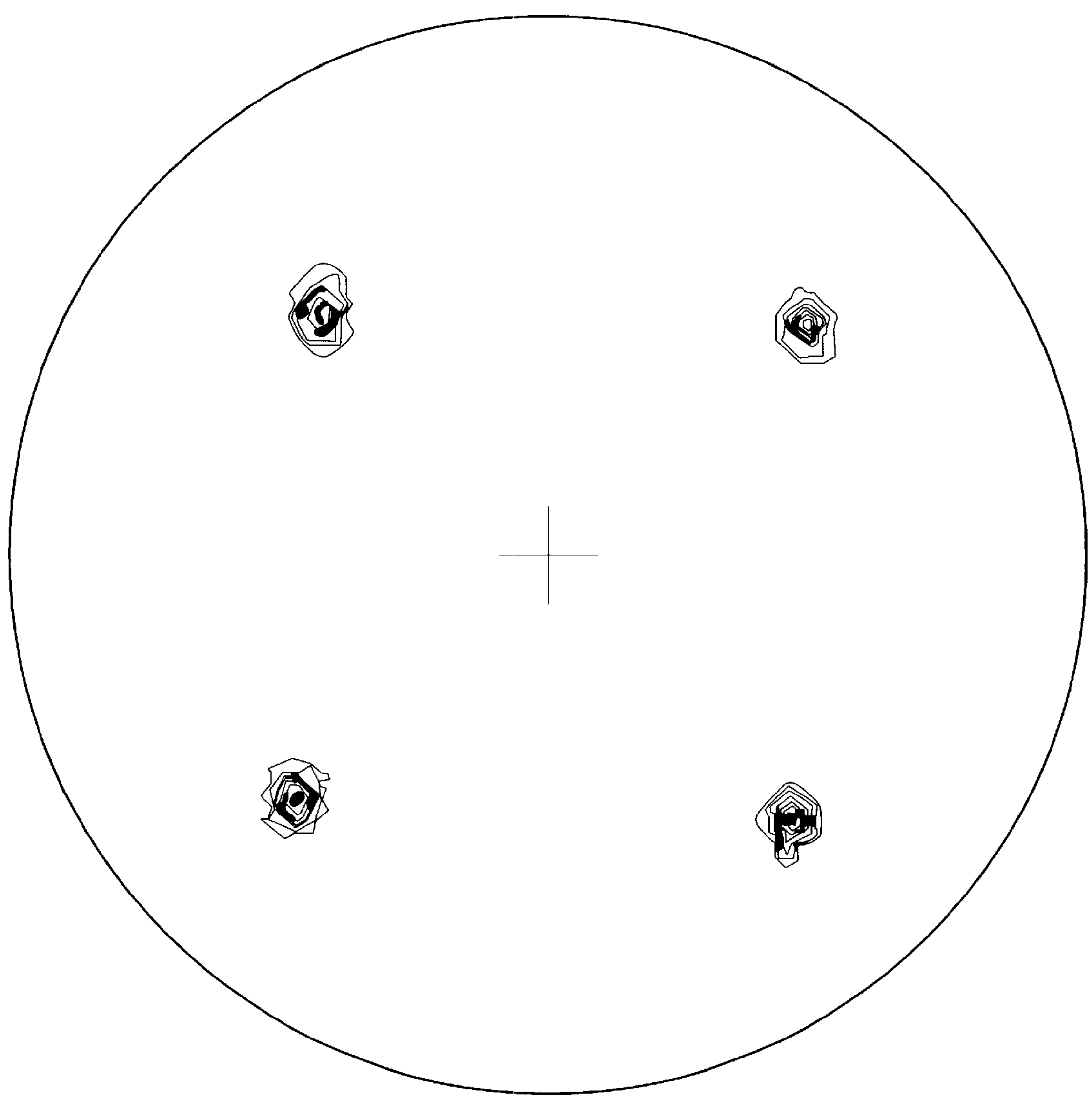
FIG. 5 shows a (111) pole figure for a Ni-9 at %W alloy fabricated by rolling and annealing a compacted and sintered, powder metallurgy preform. The pole figure indicates only four peaks consistent with only a well-developed {100}<100>, biaxial cube texture. The final annealing temperature of the sample was 1400° C.
Figure 6:
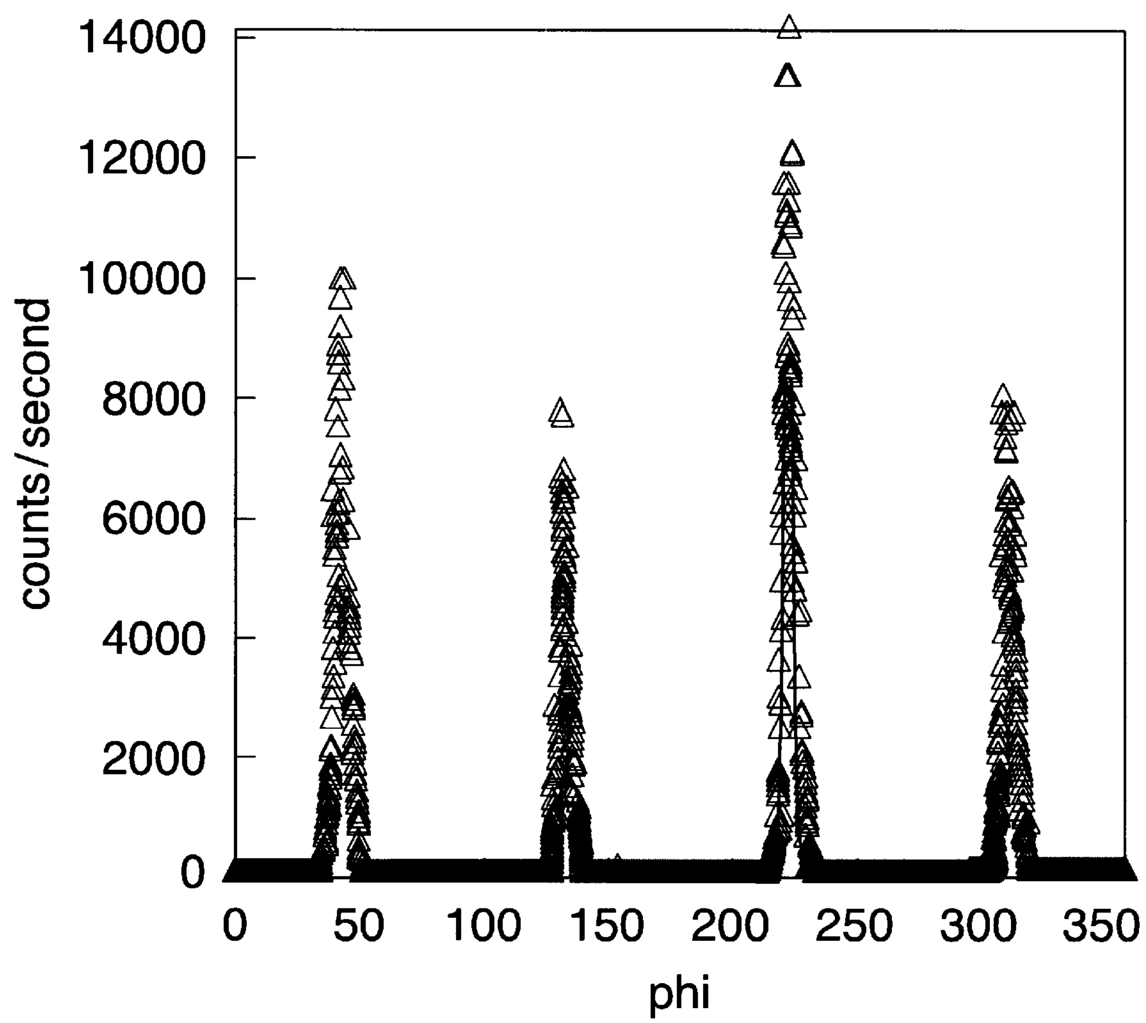
FIG. 6 shows a phi (ϕ) scan of the [111] reflection, with ϕ varying from 0° to 360°, for a Ni-9 at %W alloy fabricated by rolling and annealing a compacted and sintered, powder metallurgy preform. The presence of four peaks is with only a well-developed {100}<100>, biaxial cube texture is apparent. The final annealing temperature of the sample was 1400° C. The FWHM of the ϕ-scan, as determined by fitting a gaussian curve to one of the peaks is ~5.8°. The FWHM of the peaks in this scan is indicative of the in-plane texture of the grains in the sample.
Figure 7:
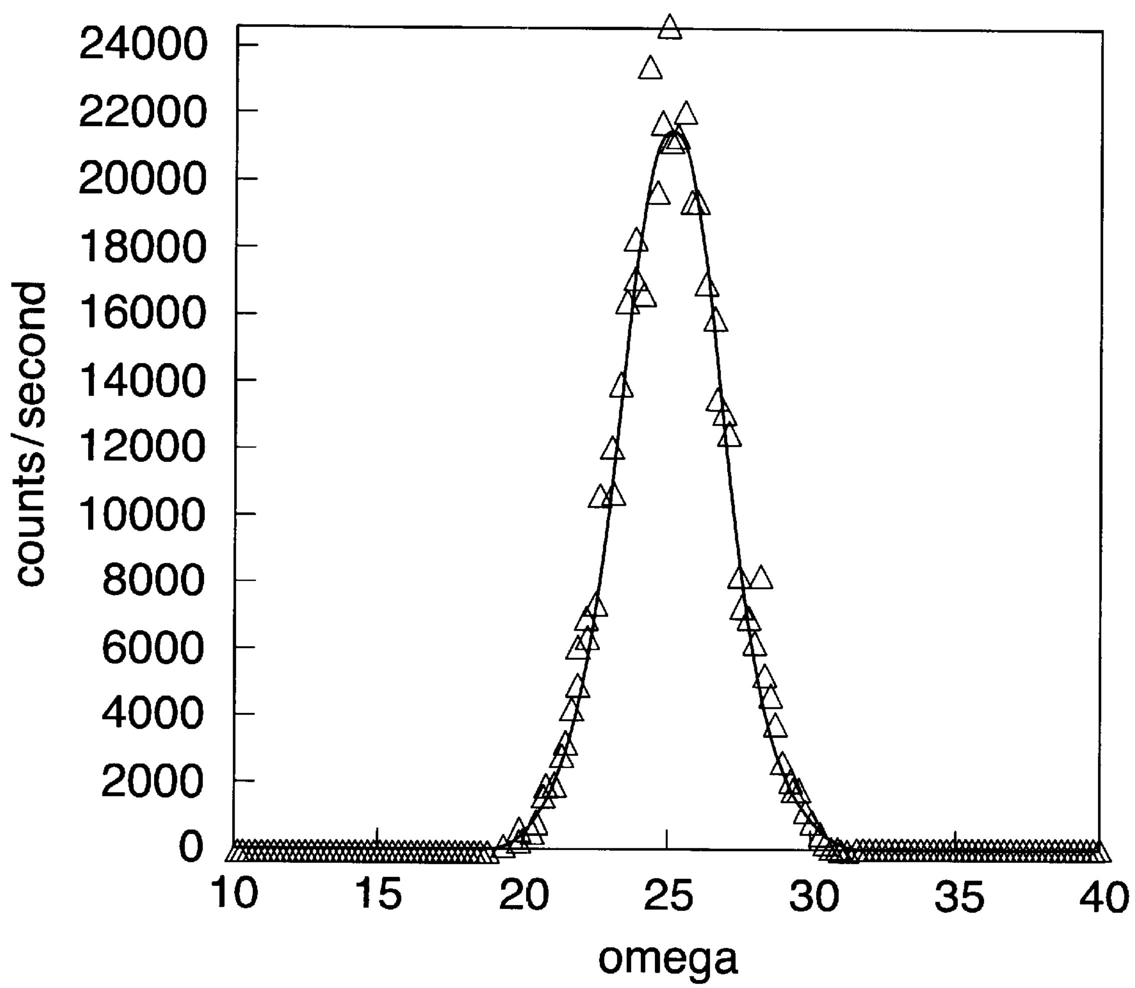
FIG. 7 shows a rocking curve (ω-scan) from 10° to 40° with the sample being rocked in the rolling direction, for a Ni-9 at %W alloy fabricated by rolling and annealing a compacted and sintered, powder metallurgy preform. The final annealing temperature of the sample was 1400° C. The peak is indicative of the out-of-plane texture of the sample. The FWHM of the ω-scan, as determined by fitting a gaussian curve to one of the peaks is ~4.3°.
Figure 8:
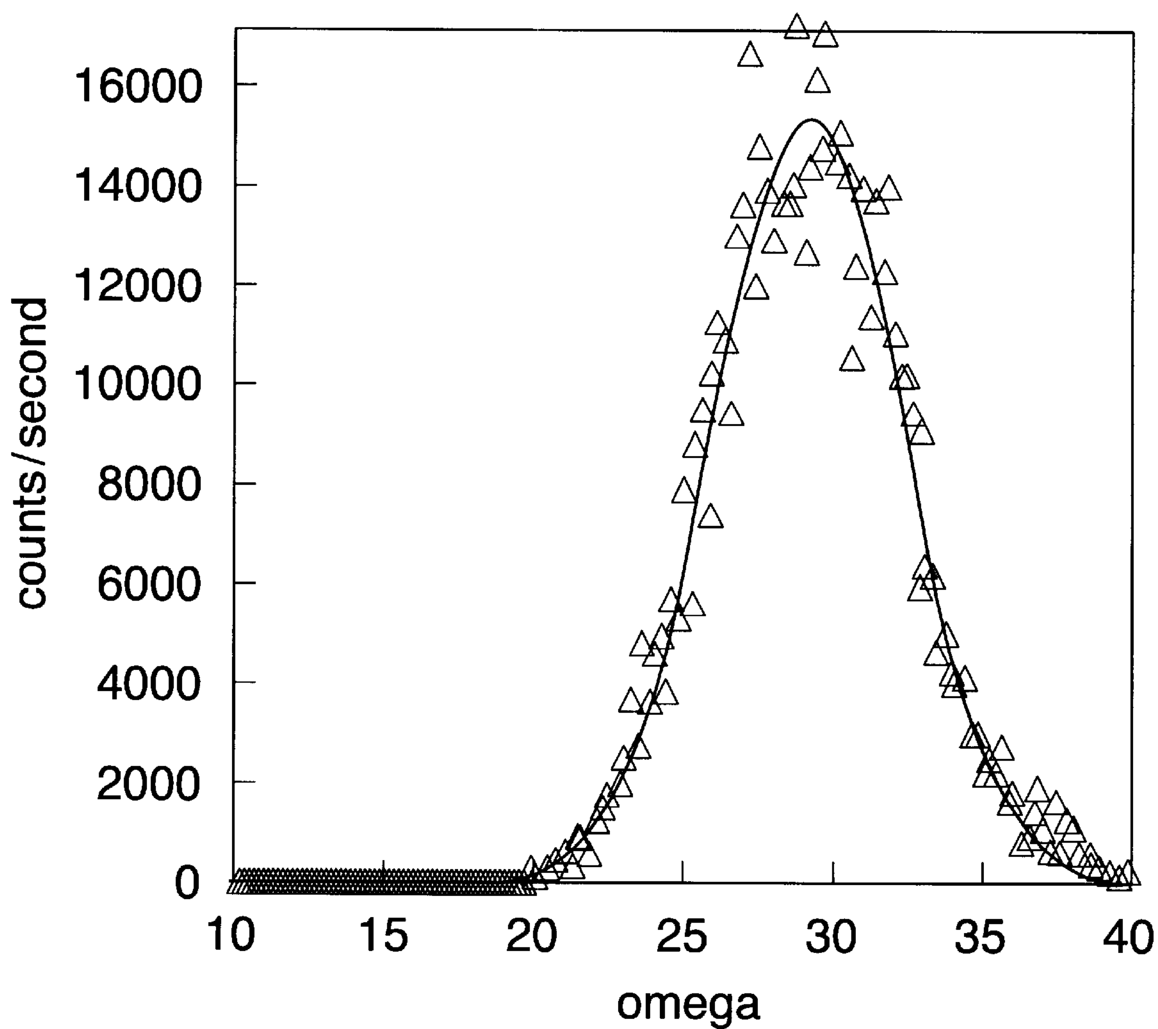
FIG. 8 shows a rocking curve (ω-scan) from 10° to 40° with the sample being rocked about the rolling direction, for a Ni-9 at %W alloy fabricated by rolling and annealing a compacted and sintered, powder metallurgy preform. The final annealing temperature of the sample was 1400° C. The peak is indicative of the out-of-plane texture of the sample. The FWHM of the ω-scan, as determined by fitting a gaussian curve to one of the peaks is ~7.4°.

FIG. 5 shows a (111) X-ray diffraction pole figure of the biaxially textured alloy substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 6 shows a phi-scan of the [111]

reflection showing the decree of in-plane texture. The FWHM of the tape is determined by fitting a gaussian curve to the data is ~6.3°. FIG. 7 shows the rocking curve or the out-of-plane texture as measured by scanning the [200] reflection of the substrate. FIG. 7 is a rocking curve with the sample being rocked in the rolling direction and shows a FWHM of 6.7°. FIG. 8 is a rocking curve with the sample being rocked about the rolling direction and shows a FWHM of 7.5°. This is truly a single orientation texture with all crystallographic axis being aligned in all direction within 6–7°. Alloys made by procedures other than what is described above result in secondary recrystallization at temperatures much below 1400° C. and do not result in single orientation cube texture as shown in the pole figure of FIG. 5.

Example III

Begin with a mixture of 87 at % Nickel powder (99.99% purity) and 13% Chromium powder. Mix and compact at appropriate pressures into a rod or billet. Then heat treat at 900° C. for 2 hr. The grain size at the end of heat treatment is less than 50 □m. Deform, by rolling, to a degree greater than 90% total deformation, preferably using 10% reduction per pass and by reversing the rolling direction during each subsequent pass. Anneal at about 1200° C. for about 60 minutes to produce a sharp biaxial texture. Annealing is performed in flowing 4% $H_2$ in Ar.

Figure 9:
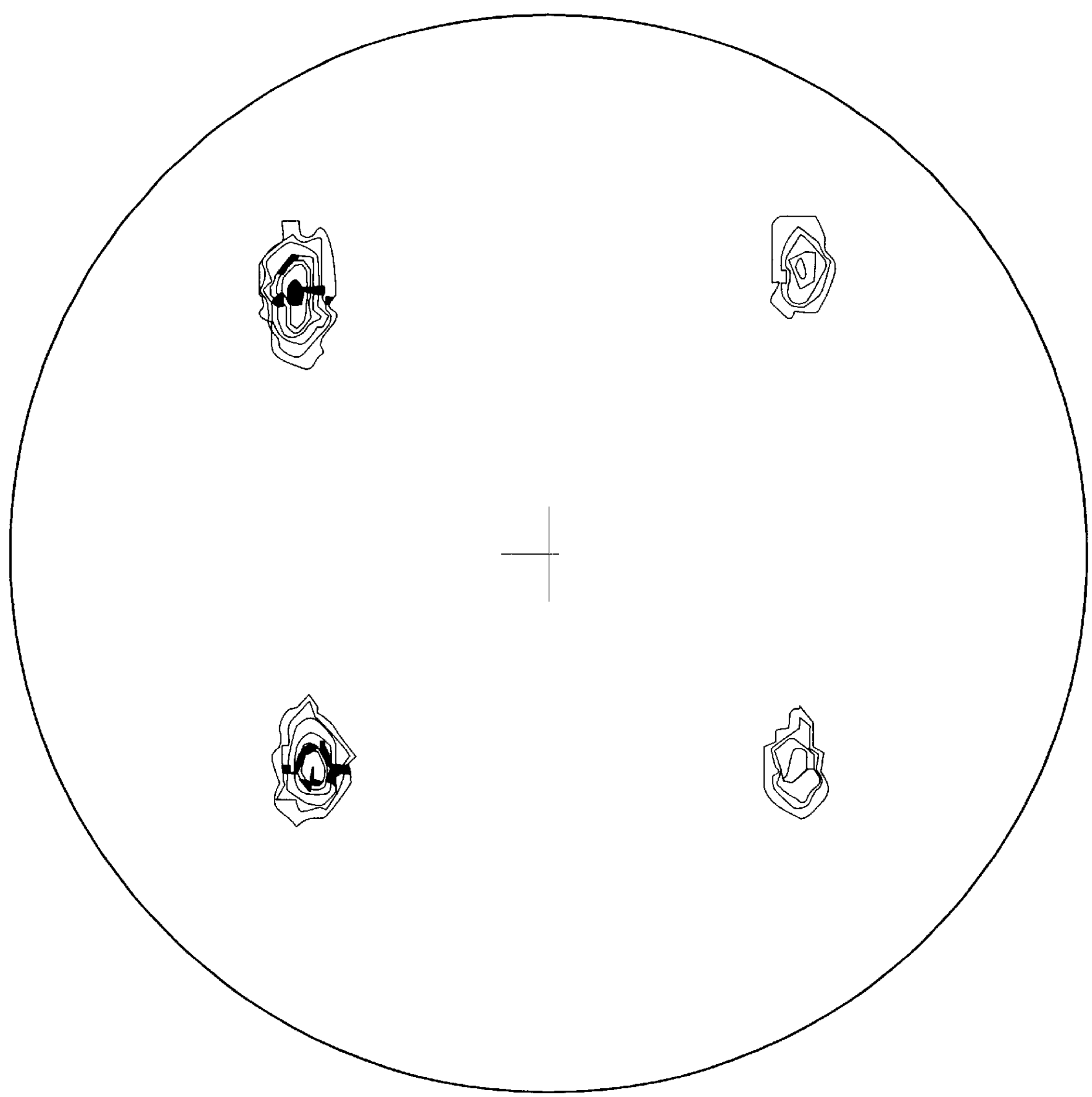
FIG. 9 shows a (111) pole figure for a Ni-13 at %Cr alloy fabricated by rolling and annealing a compacted and sintered, powder metallurgy preform. The pole figure indicates only four peaks consistent with only a well-developed {100}<100>, biaxial cube texture. The final annealing temperature of the sample was 1200° C.
Figure 10:
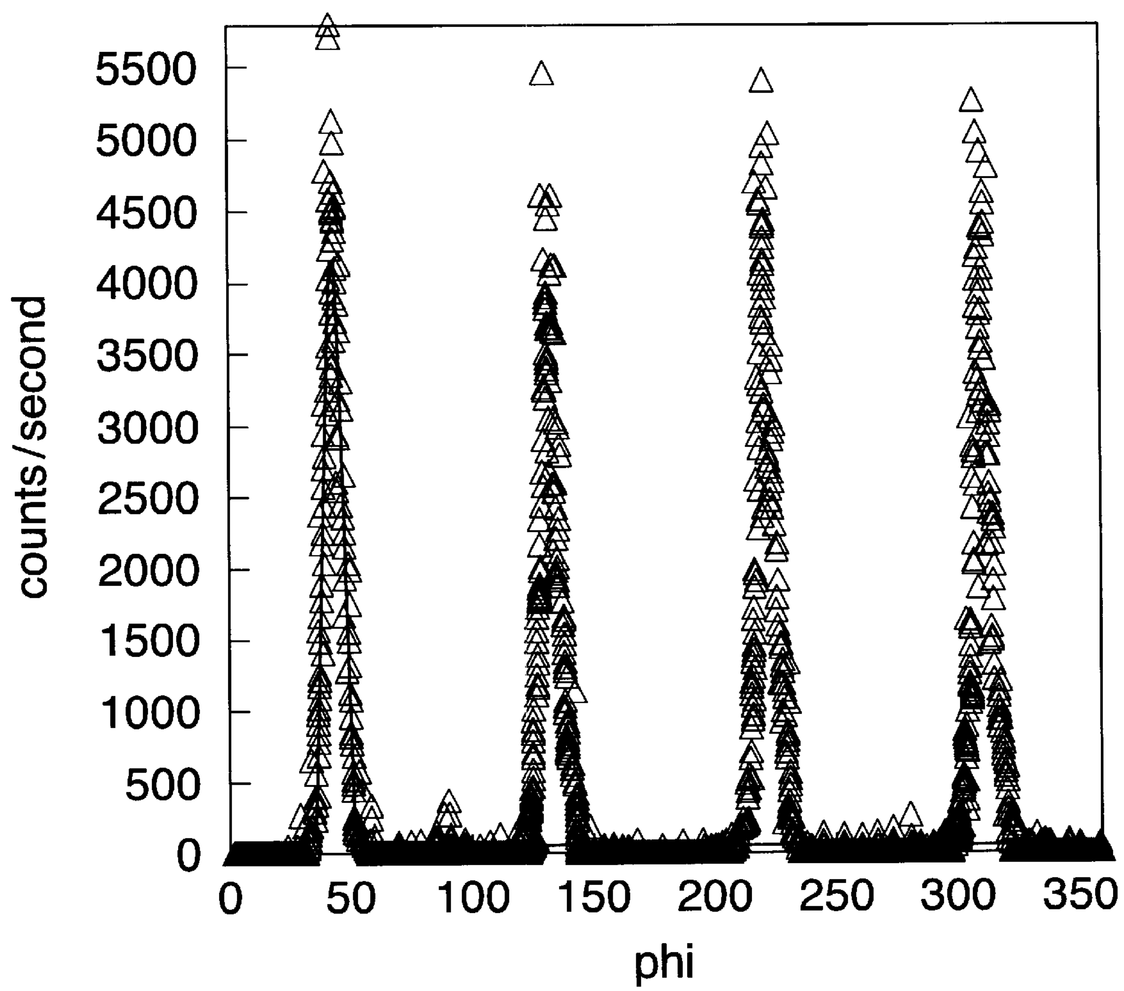
FIG. 10 shows a phi (ϕ) scan of the [111] reflection, with ϕ varying from 0° to 360°, for a Ni-13 at %Cr alloy fabricated by rolling and annealing a compacted and sintered, powder metallurgy preform. The presence of four peaks is with only a well-developed {100}<100>, biaxial cube texture is apparent. The final annealing temperature of the sample was 1200° C. The FWHM of the ϕ-scan, as determined by fitting a gaussian curve to one of the peaks is ~8.7°. The FWHM of the peaks in this scan is indicative of the in-plane texture of the grains in the sample.
Figure 11:
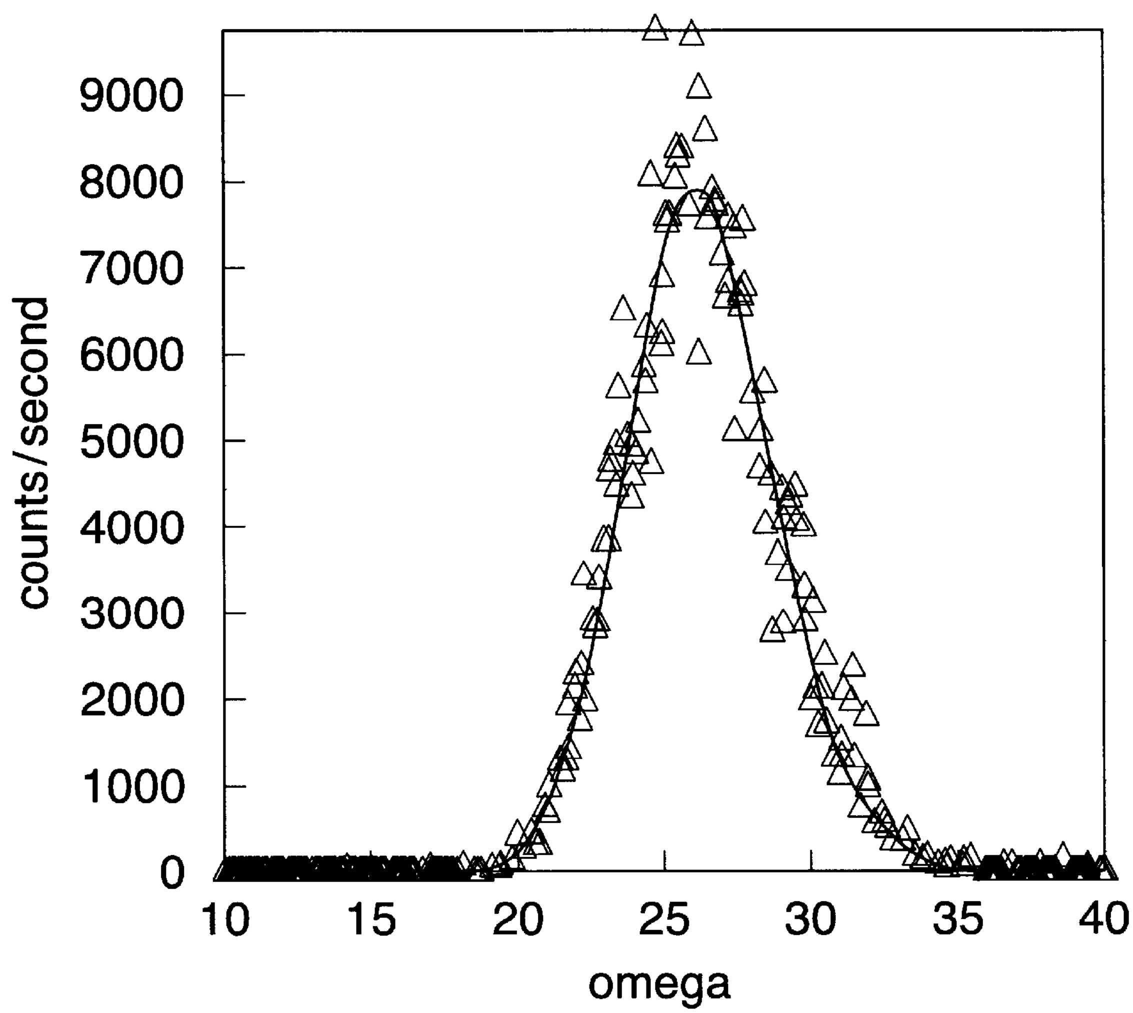
FIG. 11 shows a rocking curve (ω-scan) from 10° to 40° with the sample being rocked in the rolling direction, for a Ni-13 at %Cr alloy fabricated by rolling and annealing a compacted and sintered, powder metallurgy preform. The final annealing temperature of the sample was 1200° C. The peak is indicative of the out-of-plane texture of the sample. The FWHM of the ω-scan, as determined by fitting a gaussian curve to one of the peaks is ~5.8°.
Figure 12:
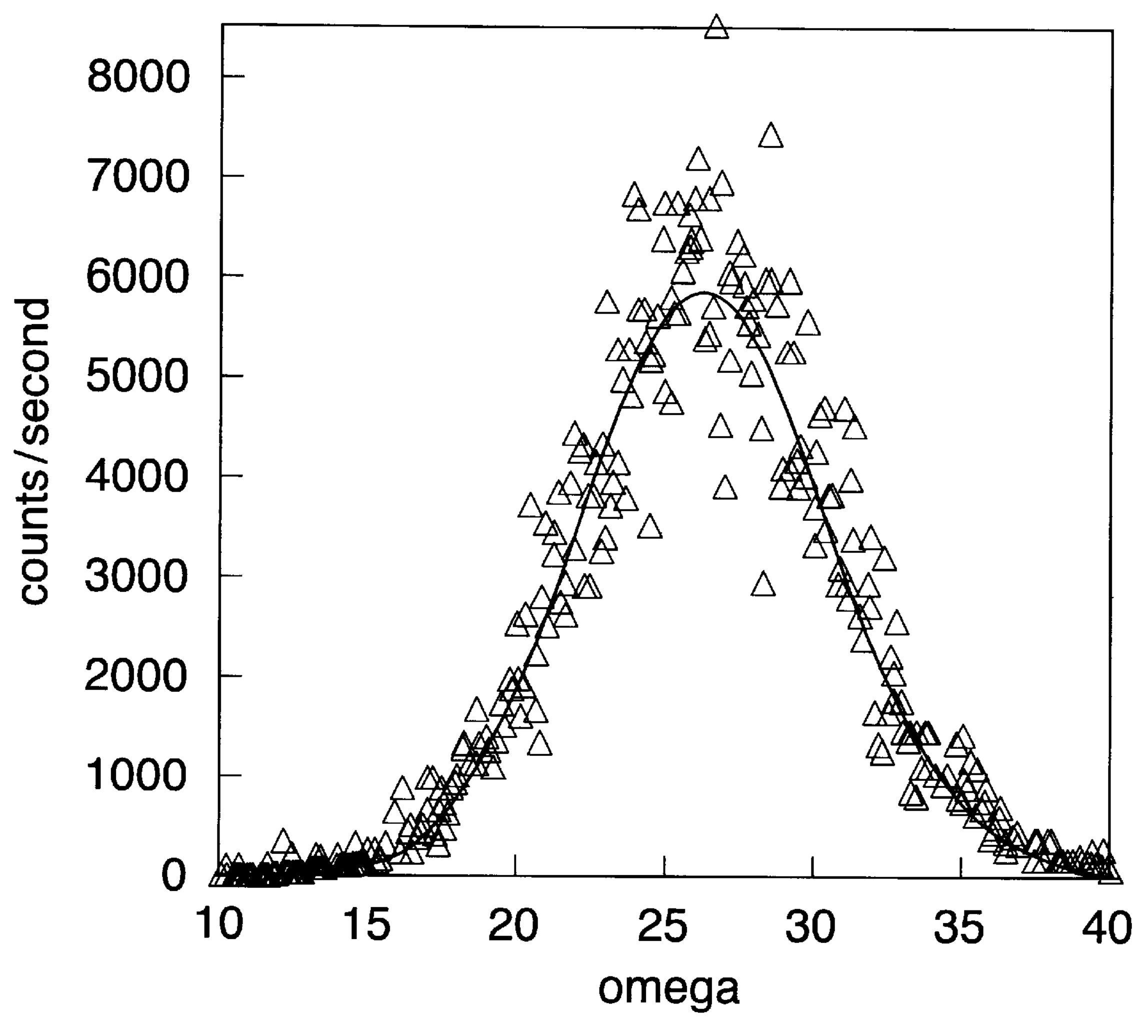
FIG. 12 shows a rocking curve (ω-scan) from 10° to 40° with the sample being rocked about the rolling direction, for a Ni-13 at %Cr alloy fabricated by rolling and annealing a compacted and sintered, powder metallurgy preform. The final annealing temperature of the sample was 1200° C. The peak is indicative of the out-of-plane texture of the sample. The FWHM of the ω-scan, as determined by fitting a gaussian curve to one of the peaks is ~9.8°.

FIG. 9 shows a (111) X-ray diffraction pole figure of the biaxially textured alloy substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 10 shows a phi-scan of the [111] reflection showing the degree of in-plane texture. The FWHM of the tape determined by fitting a gaussian curve to the data is 8.68°. FIG. 11 shows the rocking curve or tile out-of-plane texture as measured by scanning the [200] reflection of the substrate. FIG. 11 is a rocking curve with the sample being rocked in the rolling direction and shows a FWHM of 5.83°. FIG. 12 is a rocking curve with the sample being rocked about the rolling direction and shows a FWHM of 9.82°. This is truly a single orientation texture with all crystallographic axis being aligned in all directions within 8–10°. Alloys made by procedures other than what is described above result in secondary recrystallization at 1200° C.

Example IV

Begin with a mixture of 87 at % Nickel powder (99.99% purity) and 13% Chromium powder. Mix and compact at appropriate pressures into a rod or billet. Then heat treat at 900° C. for 2 hr. The grain size at tile end of heat treatment is less than 50 □m. Deform, by rolling, to a degree greater than 90% total deformation, preferably using 10% reduction per pass and by reversing the rolling direction during each subsequent pass. Anneal at about 1400° C. for about 60 minutes to produce a sharp biaxial texture. Annealing is performed in flowing 4% $H_2$ in Ar.

Figure 13:
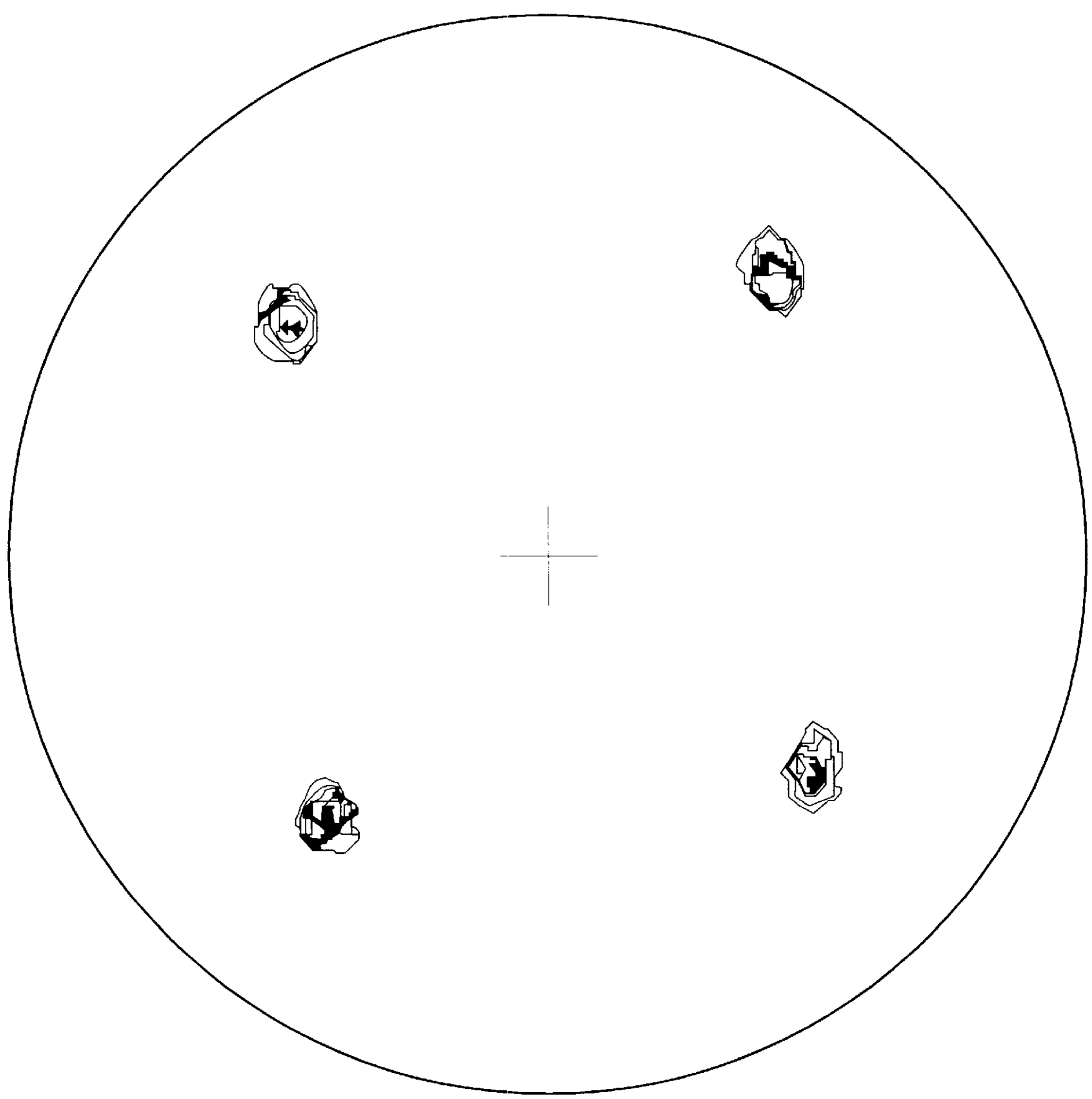
FIG. 13 shows a (111) pole figure for a Ni-13 at %Cr alloy fabricated by rolling and annealing a compacted and sintered, powder metallurgy preform. The pole figure indicates only four peaks consistent with only a well-developed {100}<100>, biaxial cube texture. The final annealing temperature of the sample was 1400° C.
Figure 14:
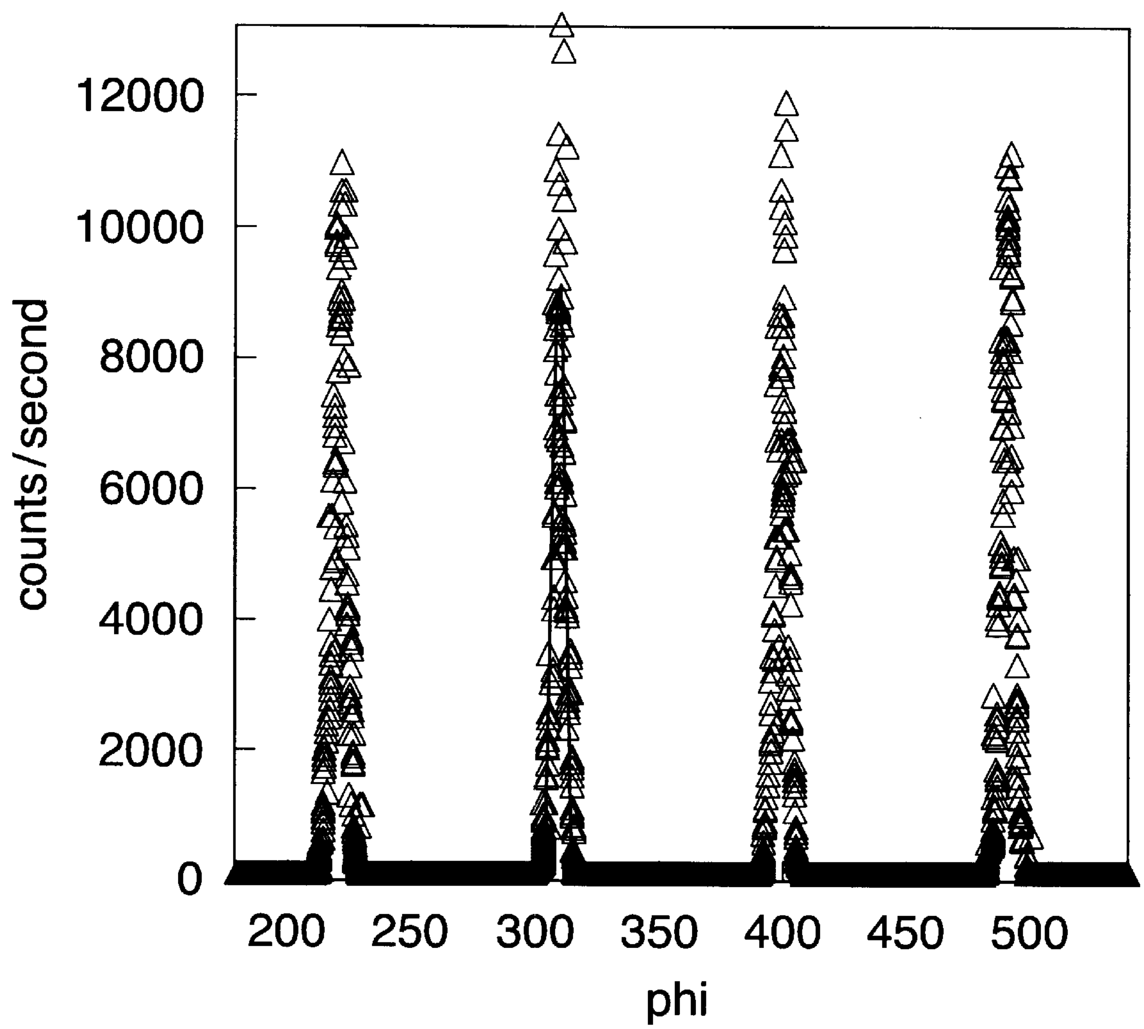
FIG. 14 shows a phi (ϕ) scan of the [111] reflection, with ϕ varying from 0° to 360°, for a Ni-13 at %Cr alloy fabricated by rolling and annealing a compacted and sintered, powder metallurgy preform. The presence of four peaks is with only a well-developed {100}<100>, biaxial cube texture is apparent. The final annealing temperature of the sample was 1400° C. The FWHM of the ϕ-scan, as determined by fitting a gaussian curve to one of the peaks is ~6.1°. The FWHM of the peaks in this scan is indicative of the in-plane texture of the grains in the sample.
Figure 15:
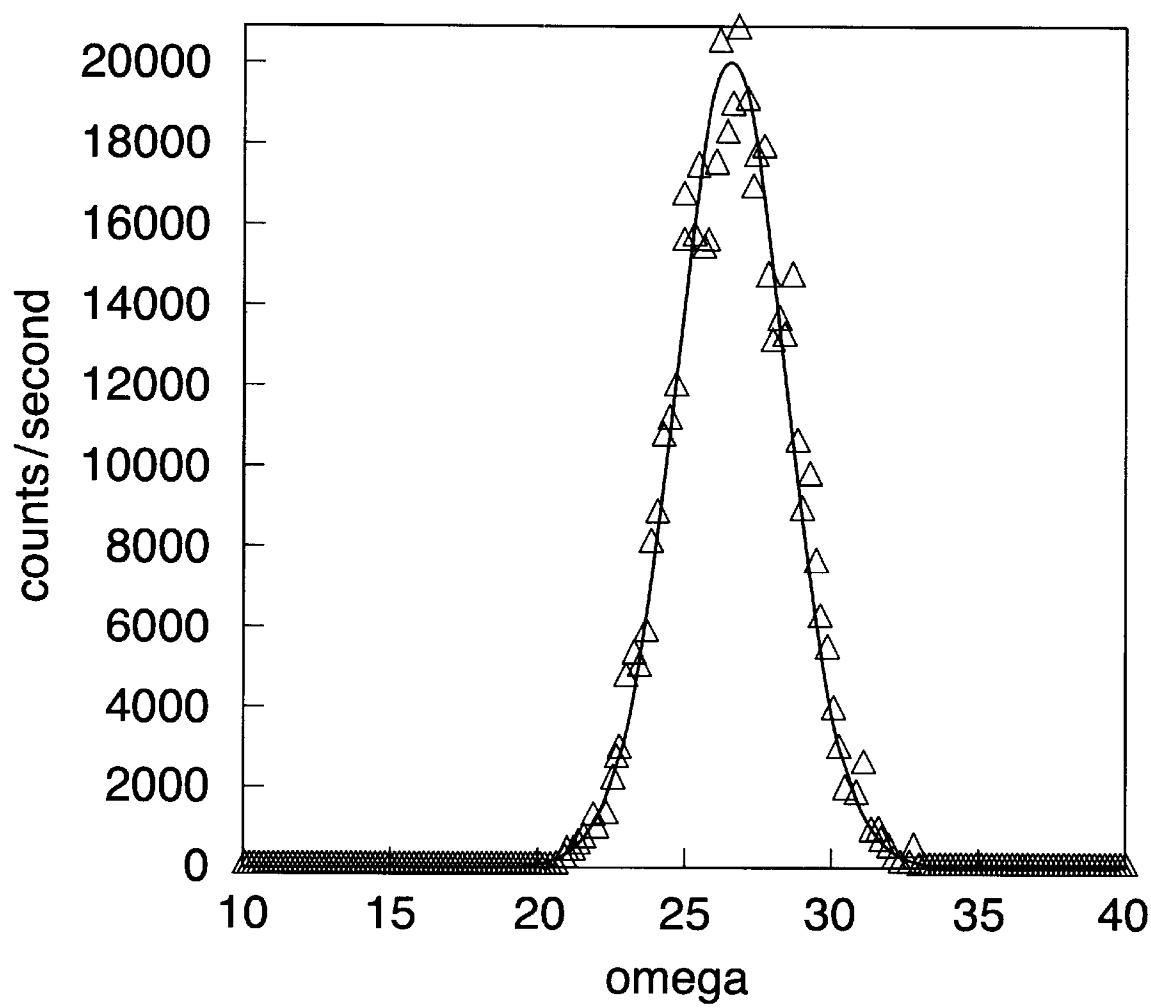
FIG. 15 shows a rocking curve (ω-scan) from 10° to 40° with the sample being rocked in the rolling direction, for a Ni-13 at %Cr alloy fabricated by rolling and annealing a compacted and sintered, powder metallurgy preform. The final annealing temperature of the sample was 1400° C. The peak is indicative of the out-of-plane texture of the sample. The FWHM of the ω-scan, as determined by fitting a gaussian curve to one of the peaks is ~4.5°.
Figure 16:
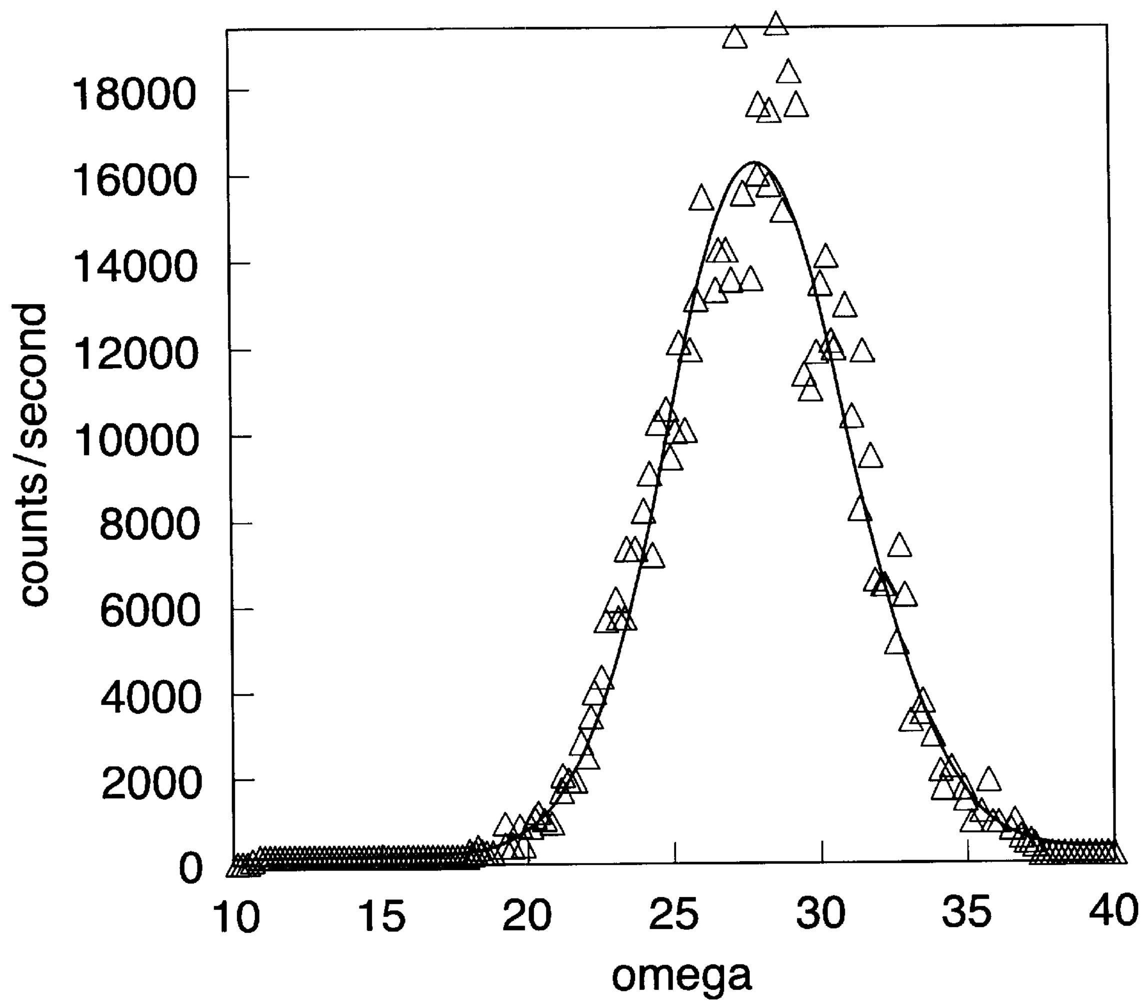
FIG. 16 shows a rocking curve (ω-scan) from 10° to 40° with the sample being rocked about the rolling direction, for a Ni-13 at %Cr alloy fabricated by rolling and annealing a compacted and sintered, powder metallurgy preform. The final annealing temperature of the sample was 1400° C. The peak is indicative of the out-of-plane texture of the sample. The FWHM of the ω-scan, as determined by fitting a gaussian curve to one of the peaks is ~7.3°.

FIG. 13 shows a (111) X-ray diffraction pole figure of the biaxially textured alloy substrate. As can be seen, only foul peaks are evident. Each peak refers to one of four crystallographically similar orientations corresponding to {100}<100>, such that the (100) plane is parallel to the surface of the tape and <100> direction is aligned along the long axis of the tape. FIG. 14 shows a phi-scan of the [111] reflection showing the degree of in-plane texture. The FWHM of the tape determined by fitting a gaussian curve to the data is ~6.1°. FIG. 15 shows the rocking curve or the out-of-plane texture as measured by scanning the [200] reflection of the substrate. FIG. 15 is a rocking curve with the sample being rocked in the rolling direction and shows a FWHM of 4.5°. FIG. 16 is a rocking curve with the sample being rocked about the rolling direction and shows a FWHM of 7.3°. This is truly a single orientation texture with all crystallographic axis being aligned in all directions within 6–7°. Alloys made by procedures other than the what is described above result in secondary recrystallization at temperatures much below 1400° C. and do not result in single orientation cube texture as shown in the pole figure of FIG. 13.

Similar experiments can be performed with binary alloys of Ni—Cu, Ni—V, Ni—Mo, Ni—Al, and with ternary alloys of Ni—Cr—Al, Ni—W—Al, Ni—V—Al, Ni—Mo—Al, Ni—Cu—Al. Similar results are also expected for 100% Ag and Ag alloys such Ag—Cu, Ag—Pd.

PROCEDURES AND EXAMPLES TO OBTAIN BIAXIALLY-TEXTURED ALLOYS WITH A DISTRIBUTION OF CERAMIC PARTICLES FOR MECHANICAL STRENGTHENING

Conventional wisdom and numerous experimental results indicate that hard, ceramic particles are introduced or dispersed within a metal or alloy it results in significant mechanical strengthening. This arises primarily due to enhanced defect or dislocation generation should this material be deformed. Conventional wisdom and prior experimental results also indicate because of the presence of such hard, ceramic particles, and the enhanced defect generation locally at these particles, the deformation is very inhomogeneous. Inhomogeneous deformation essentially prevents the formation of any sharp crystallographic texture. Hence, conventional wisdom and prior experimental results show that the presence of even a very small concentration of ceramic particles result in little texture formation even in high purity FCC metals such as Cu and Ni. Here we provide a method where ceramic particles can be introduced in a homogeneous fashion to obtain mechanical strengthening of the substrate, and still obtain a high degree of biaxial texture. The key is to have a particle size of less than 1 $\mu$m and uniform distribution of the ceramic particles in the final preform, prior to the final rolling to obtain biaxial texture.

EXAMPLE V

Begin with a mixture of 0.03 at % Mg and remaining Ni powder. Mix and compact at appropriate pressures into a rod or billet. Then heat treat at 900° C. for 2 hr. During this thermomechanical processing all the Mg is converted to MgO and it is dispersed in a fine and homogeneous manner throughout the preform. The grain size at the end of heat treatment is less than 50 □m. Deform, by rolling, to a degree greater than 90% total deformation, preferably using 10% reduction per pass and by reversing the rolling direction during each subsequent pass. Anneal at about 1200° C. for about 60 minutes to produce a sharp biaxial texture. Annealing is performed in flowing 4% $H_2$ in Ar.

Figure 17:
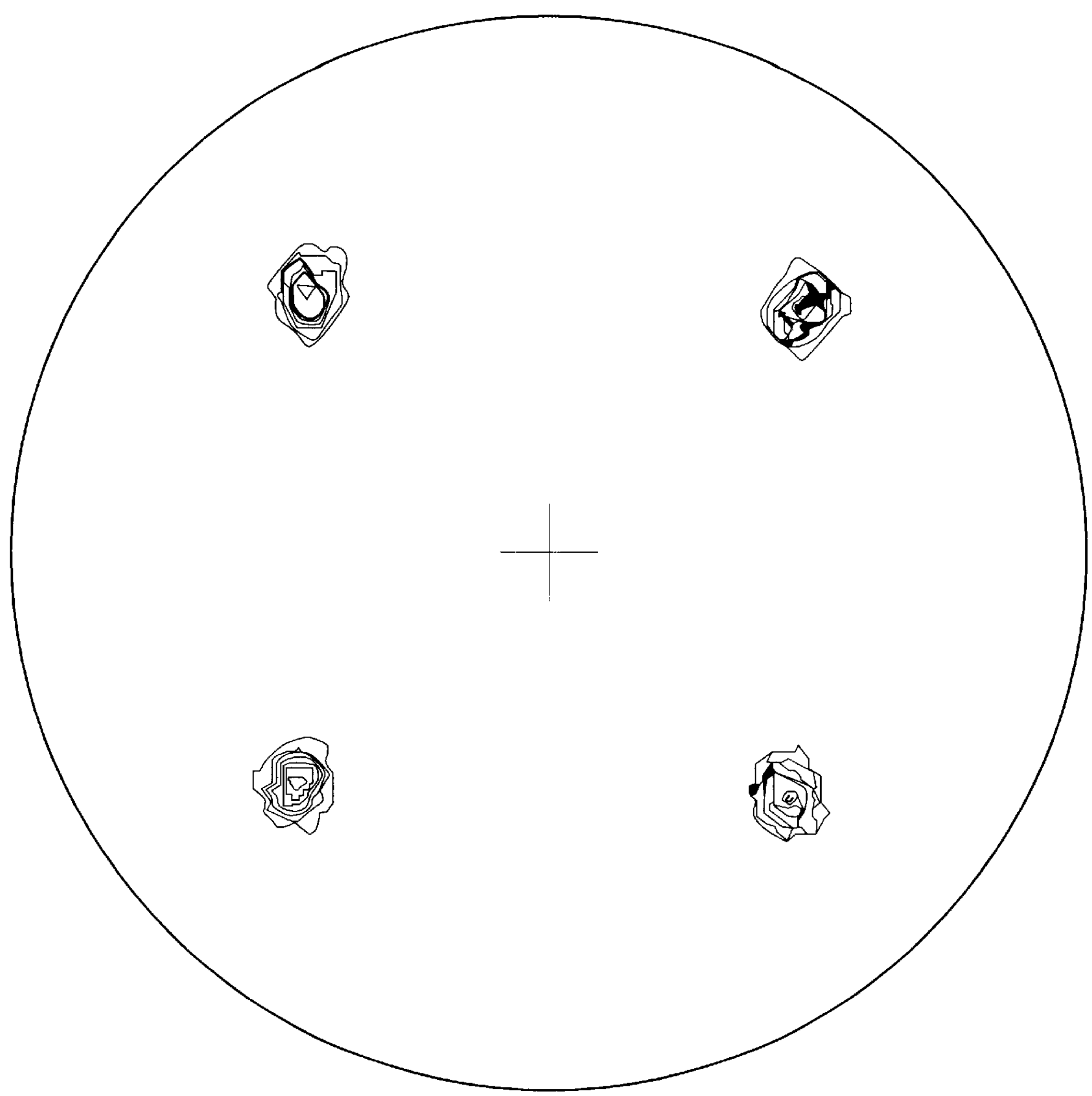
FIG. 17 shows a (111) pole figure for a Ni-0.03 at %Mg alloy fabricated by rolling and annealing a compacted and sintered, powder metallurgy preform. The Mg is predominantly expected to be present as MgO. The pole figure indicates only four peaks consistent with only a well-developed {100}<100>, biaxial cube texture. The final annealing temperature of the sample was 1200° C.
Figure 18:
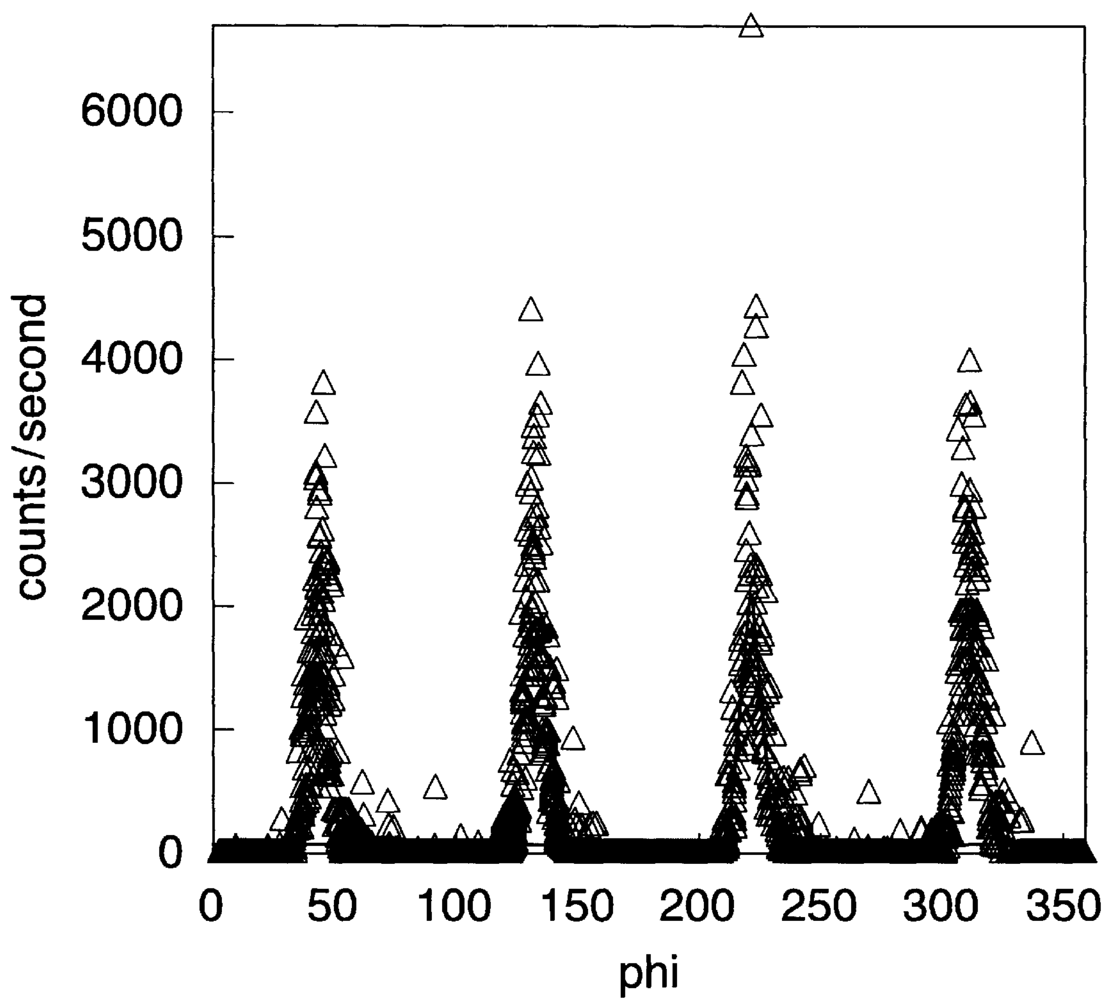
FIG. 18 shows a phi ($\phi$) scan of the [111] reflection, with $\phi$ varying from 0° to 360°, for a Ni-0.03 at %Mg, alloy fabricated by rolling and annealing a compacted and sintered, powder metallurgy preform. The presence of foul peaks is with only a well-developed {100}<100>, biaxial cube texture is apparent. The final annealing temperature of the sample was 1200° C. The FWHM of the $\phi$-scan, as determined by fitting a gaussian curve to one of the peaks is ~7.7°. The FWHM of the peaks in this scan is indicative of the in-plane texture of the grains in the sample.
Figure 19:
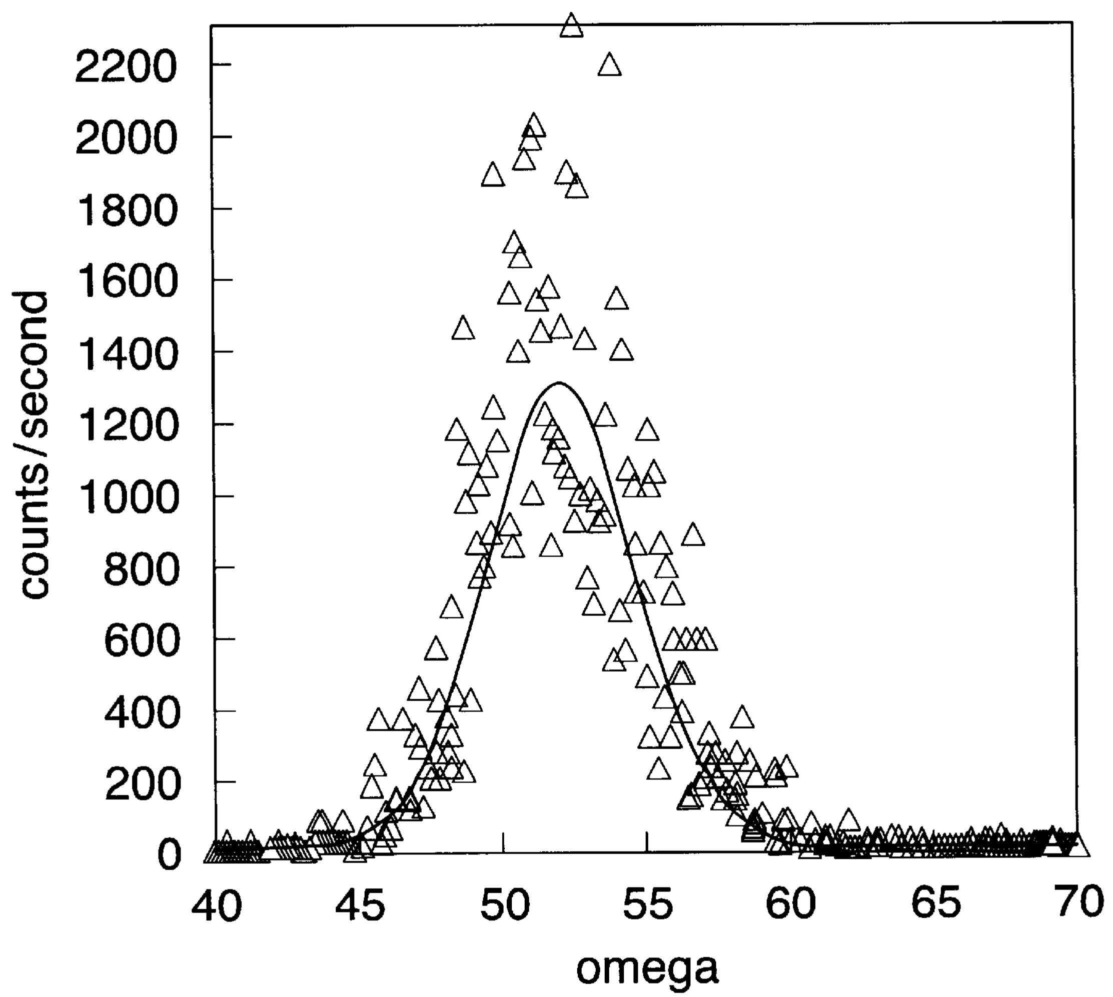
FIG. 19 shows a rocking curve ($\omega$-scan) from 10° to 40° with the sample being rocked in the rolling direction, for a Ni-0.03 at %Mg alloy fabricated by rolling and annealing a compacted and sintered, powder metallurgy preform. The final annealing temperature of the sample was 1200° C. The peak is indicative of the out-of-plane texture of the sample. The FWHM of the $\omega$-scan, as determined by fitting, a gaussian curve to one of the peaks is ~7.8°.
Figure 20:
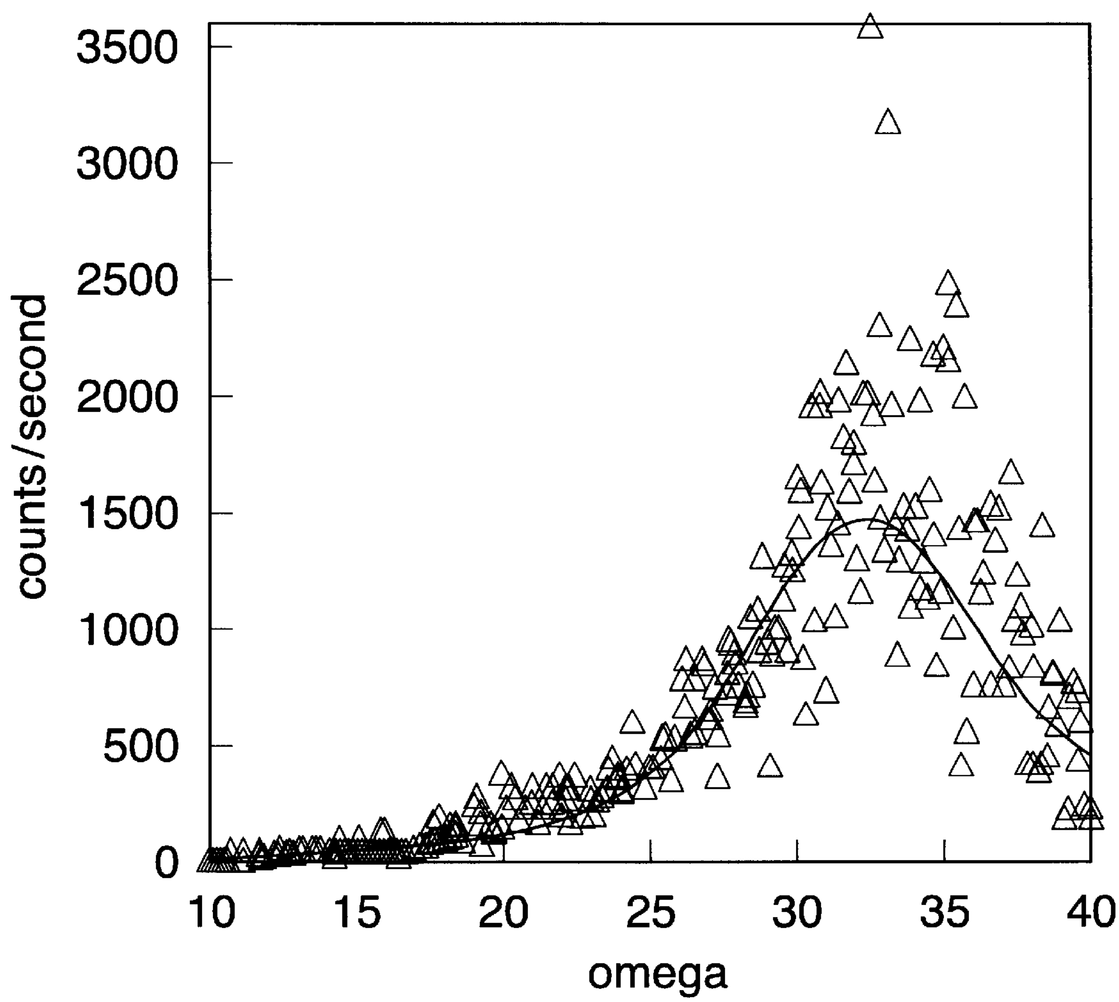
FIG. 20 shows a rocking curve ($\omega$-scan) from 10° to 40° with the sample being rocked about the rolling direction, for a Ni-0.03 at %Mg. The final annealing temperature of the sample was 1200° C. The peak is indicative of the out-of-plane texture of the sample. The FWHM of the $\omega$-scan, as determined by fitting a gaussian curve to one of the peaks is ~9.2°.

FIG. 17 shows a (111) X-ray diffraction pole figure of the biaxially textured, particulate, composite substrate. As can be seen, only foul peaks are evident. Each peak refers to one of four crystallographically similar orientations corresponding to {100}<100>, such that the (100) plane is parallel to the surface of the tape and <100> direction is aligned along the long axis of the tape. FIG. 18 shows a phi-scan of the [111] reflection showing the degree of in-plane texture. The FWHM of the tape determined by fitting a gaussian curve to the data is ~8.68°. FIG. 19 shows the rocking curve or the out-of-plane texture as measured by scanning the [200] reflection of the substrate. FIG. 19 is a rocking curve with the sample being rocked in the rolling direction and shows a FWHM of 7.92°. FIG. 20 is a rocking curve with the sample being rocked about the rolling direction and shows a FWHM of 9.20°. This is truly a single orientation texture with all crystallographic axis being aligned in all directions within 8–10°. Alloy substrates made by procedures other than what is described above undergo secondary recrystallization at such annealing temperatures and lose most of their biaxial texture. On the contrary, the substrates reported here improve their biaxial textures upon annealing at temperatures as high as 1400° C.

Example VI

Begin with a mixture of 0.03 at % Mg, 9 at %W and remaining Ni powder. Mix and compact at appropriate pressures into a rod or billet. Then heat treat at 900° C. for 2 hr. During this thermomechanical processing all the Mg is converted to MgO and it is dispersed in a fine and homogeneous manner throughout the preform. The grain size at the end of heat treatment is less than 50 □m. Deform, by rolling, to a degree greater than 90% total deformation, preferably using 10% reduction per pass and by reversing the rolling direction during each subsequent pass. Anneal at about 1200° C. for about 60 minutes to produce a sharp biaxial texture. Annealing is performed in flowing 4% $H_2$ in Ar.

Figure 21:
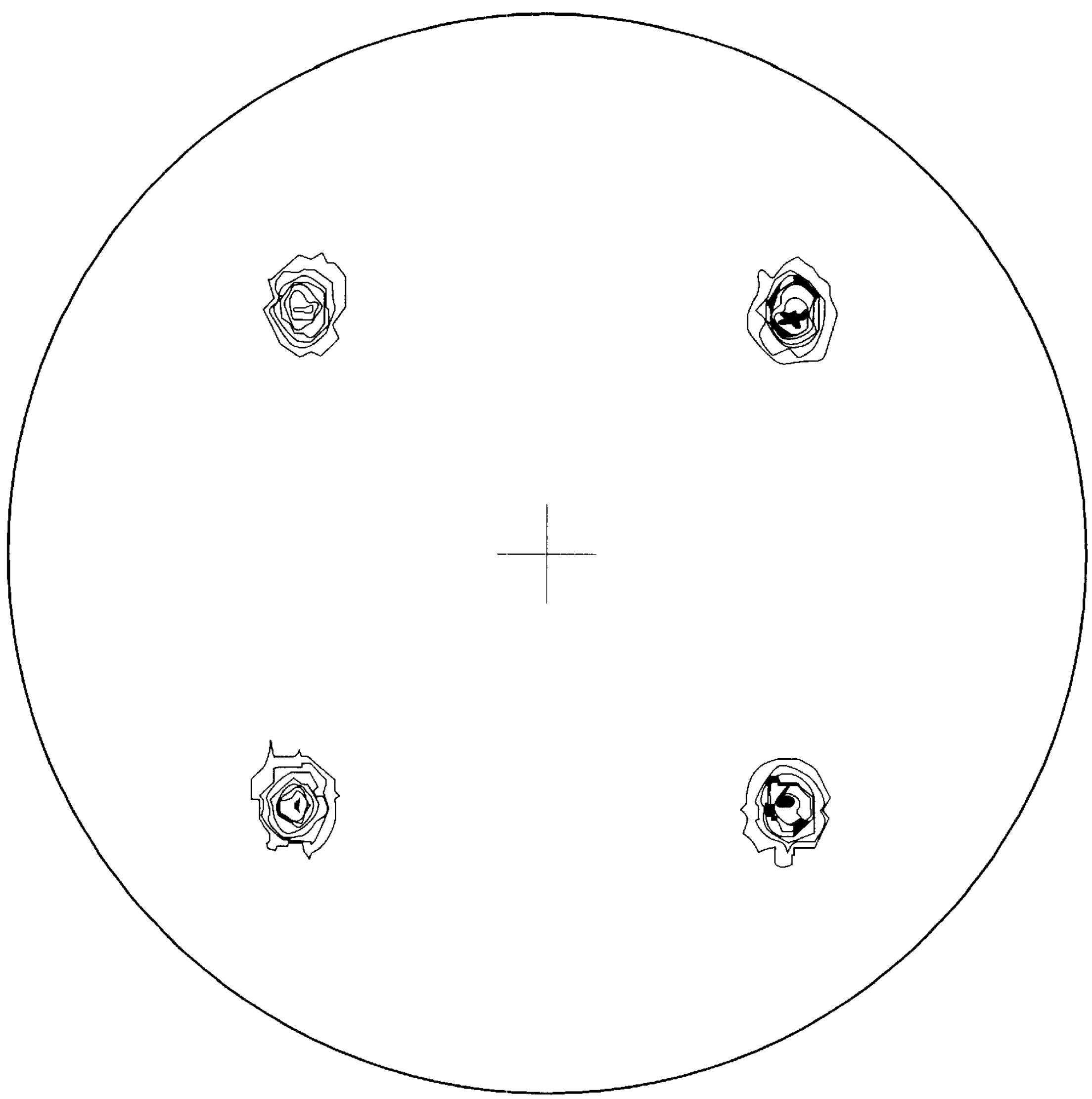
FIG. 21 shows a (111) pole figure for a Ni-9 at %W-0.03 at %Mg alloy fabricated by rolling and annealing a compacted and sintered, powder metallurgy preform. The Mg is predominantly expected to be present as MgO. The pole figure indicates only four peaks consistent with only a well-developed {100}<100>, biaxial cube texture. The final annealing, temperature of the sample was 1200° C.
Figure 22:
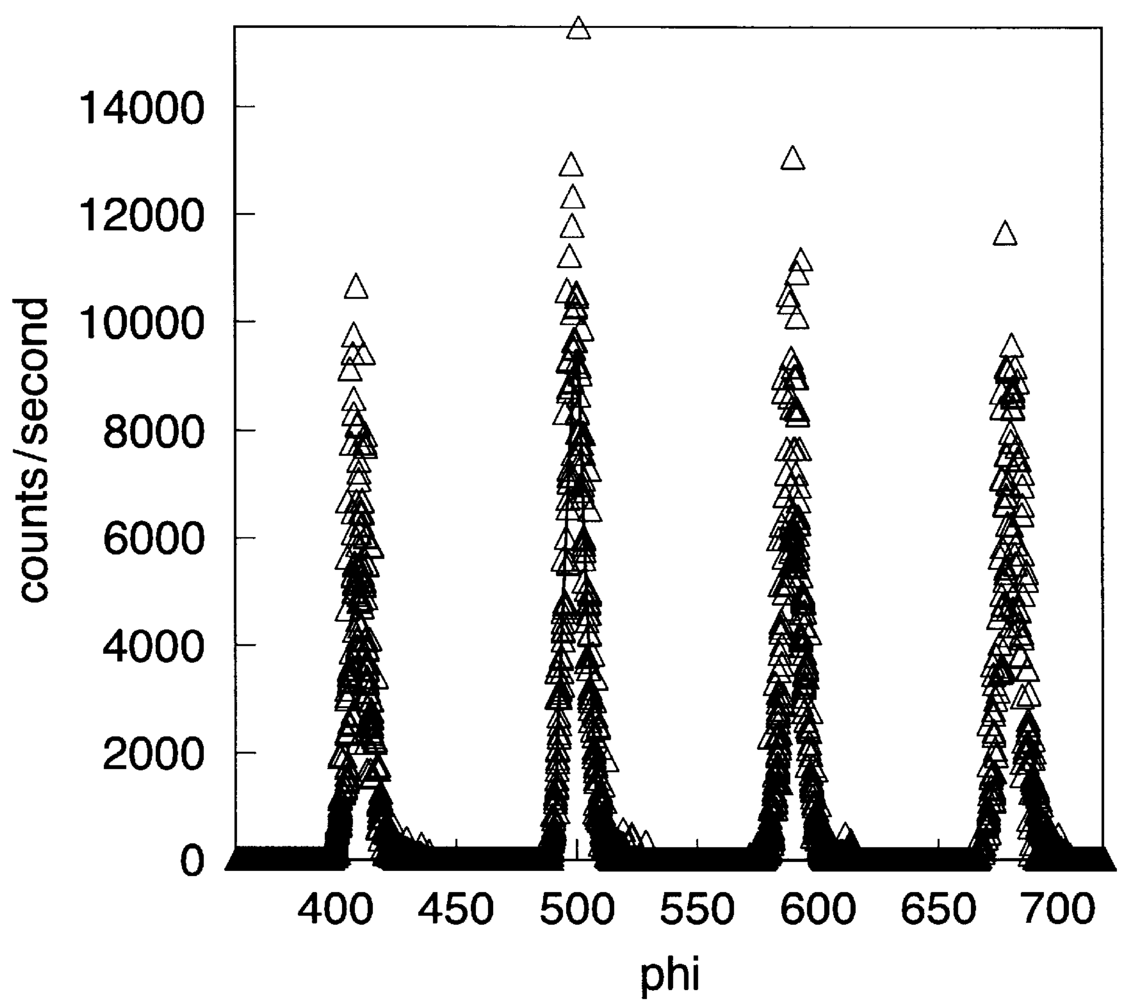
FIG. 22 shows a phi ($\phi$) scan of the [111] reflection, with 0° varying from 0° to 360°, for a Ni-9 at %W-0.03% Mg alloy fabricated by rolling and annealing a compacted and sintered, powder metallurgy preform. The presence of four peaks is with only a well-developed {100}<100>, biaxial cube texture is apparent. The final annealing temperature of the sample was 1200° C. The FWHM of the $\phi$-scan, as determined by fitting a gaussian curve to one of the peaks is ~9.1°. The FWHM of the peaks in this scan is indicative of the in-plane texture of the grains in the sample.
Figure 23:
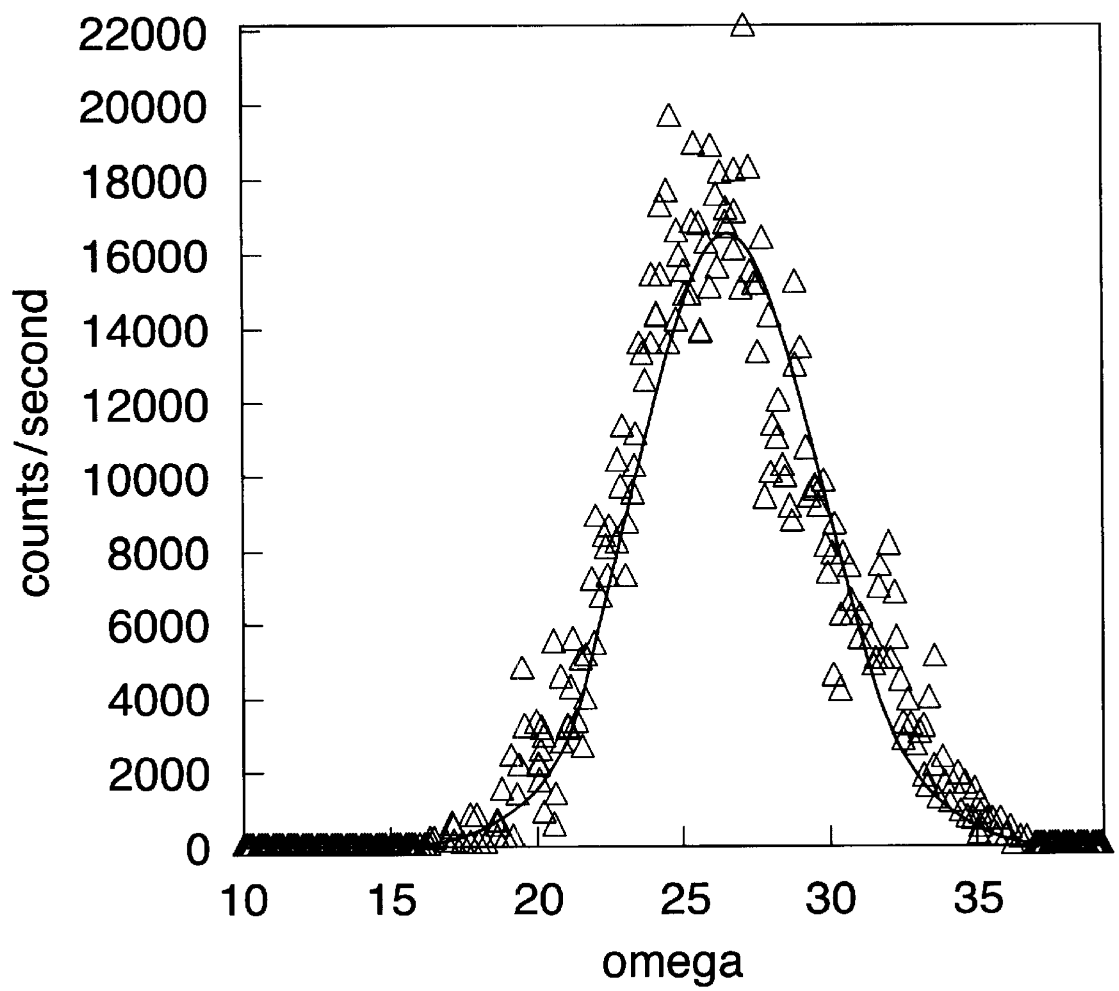
FIG. 23 shows a rocking curve ($\omega$-scan) from 10° to 40° with the sample being rocked in the rolling direction, for a Ni-9 at %W-0.03% Mg alloy fabricated by rolling and annealing a compacted and sintered, powder metallurgy preform. The final annealing temperature of the sample was 1200° C. The peak is indicative of the out-of-plane texture of the sample. The FWHM of the $\omega$-scan, as determined by fitting a gaussian curve to one of the peaks is ~7.2°.
Figure 24:
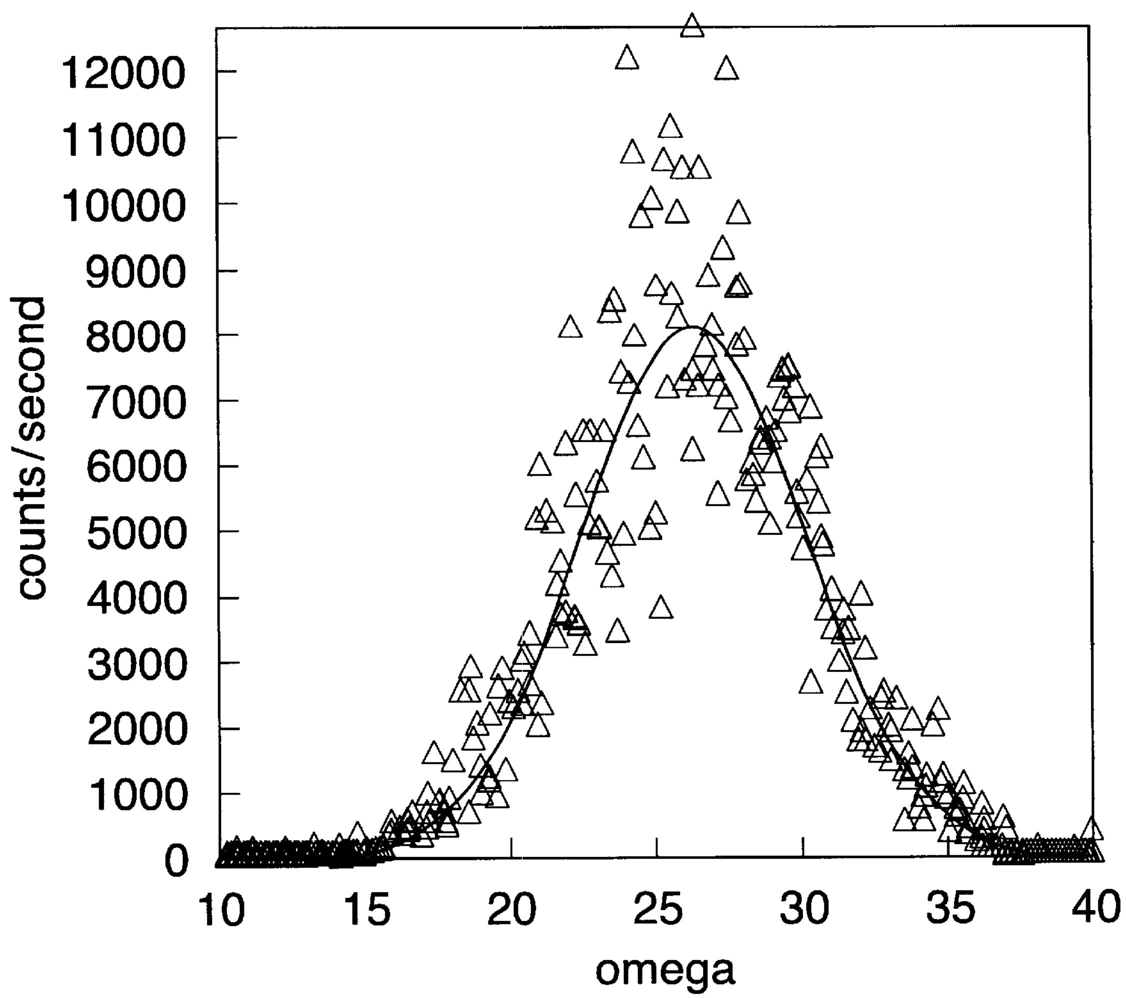
FIG. 24 shows a rocking curve ($\omega$-scan) from 10° to 40° with the sample being rocked about the rolling direction, for a Ni-9 at %W-0.03 at %Mg, alloy fabricated by rolling and annealing a compacted and sintered, powder metallurgy preform. The final annealing temperature of the sample was 1200° C. The peak is indicative of the out-of-plane texture of the sample. The FWHM of the $\omega$-scan, as determined by fitting a gaussian curve to one of the peaks is ~9.10°.

FIG. 21 shows a (111) X-ray diffraction pole figure of the biaxially textured, particulate, composite substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 22 shows a phi-scan of the [111] reflection showing the degree of in-plane texture. The FWHM of the tape determined by fitting a gaussian curve to the data is ~9.05°. FIG. 23 shows the rocking curve or the out-of-plane texture as measured by scanning the [200] reflection of the substrate. FIG. 23 is a rocking curve with the sample being rocked in the rolling direction and shows a FWHM of 7.2°. FIG. 24 is a rocking curve with the sample being rocked about the rolling direction and shows a FWHM of 9.04°. This is truly a single orientation texture with all crystallographic axis being aligned in all directions within 8–10°. Alloy substrates made by procedures other than what is described above undergo secondary recrystallization at such annealing temperatures and lose most of their biaxial texture. On the contrary, the substrates reported here improve their biaxial textures upon annealing at temperatures as high as 1400° C.

Example VII

Begin with a mixture of 0.03 at % Mg, 9 at %W and remaining Ni powder (99.99% purity). Mix and compact at appropriate pressures into a rod or billet. Then heat treat at 900° C. for 2 hr. During this thermomechanical processing all the Mg is converted to MgO and it is dispersed in a fine and homogeneous manner throughout the preform. The grain size at the end of heat treatment is less than 50 μm. Deform, by rolling, to a degree greater than 90% total deformation, preferably using 10% reduction per pass and by reversing the rolling direction during each subsequent pass. Anneal at about 1400° C. for about 60 minutes to produce a sharp biaxial texture. Annealing is performed in flowing, 4% $H_2$ in Ar.

Figure 25:
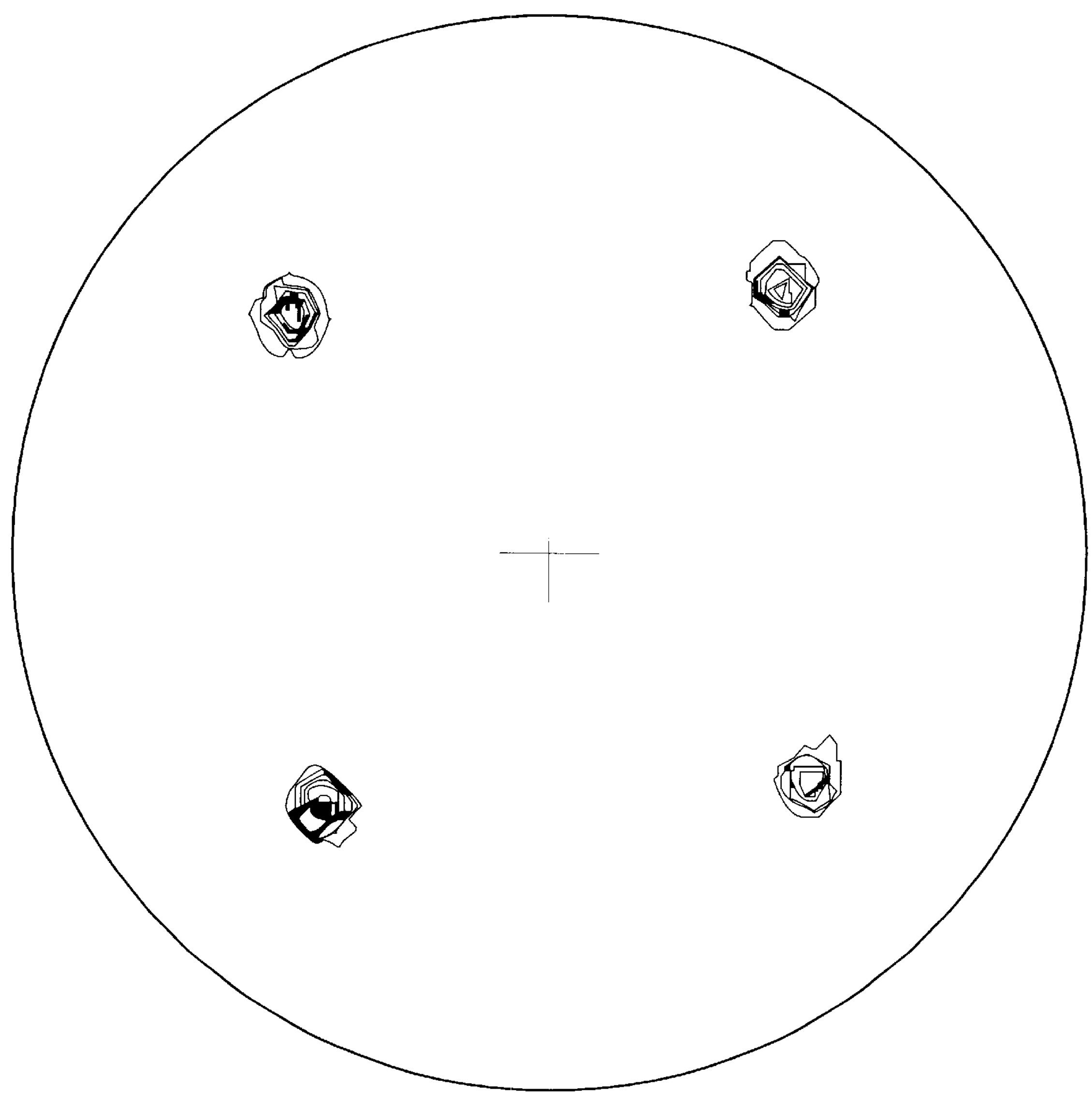
FIG. 25 shows a (111) pole figure for a Ni-9 at %W-0.03 at %Mg alloy fabricated by rolling and annealing a compacted and sintered, powder metallurgy preform. The Mg is predominantly expected to be present as MgO. The pole figure indicates only four peaks consistent with only a well-developed {100}<100>, biaxial cube texture. The final annealing temperature of the sample was 1400° C.
Figure 26:
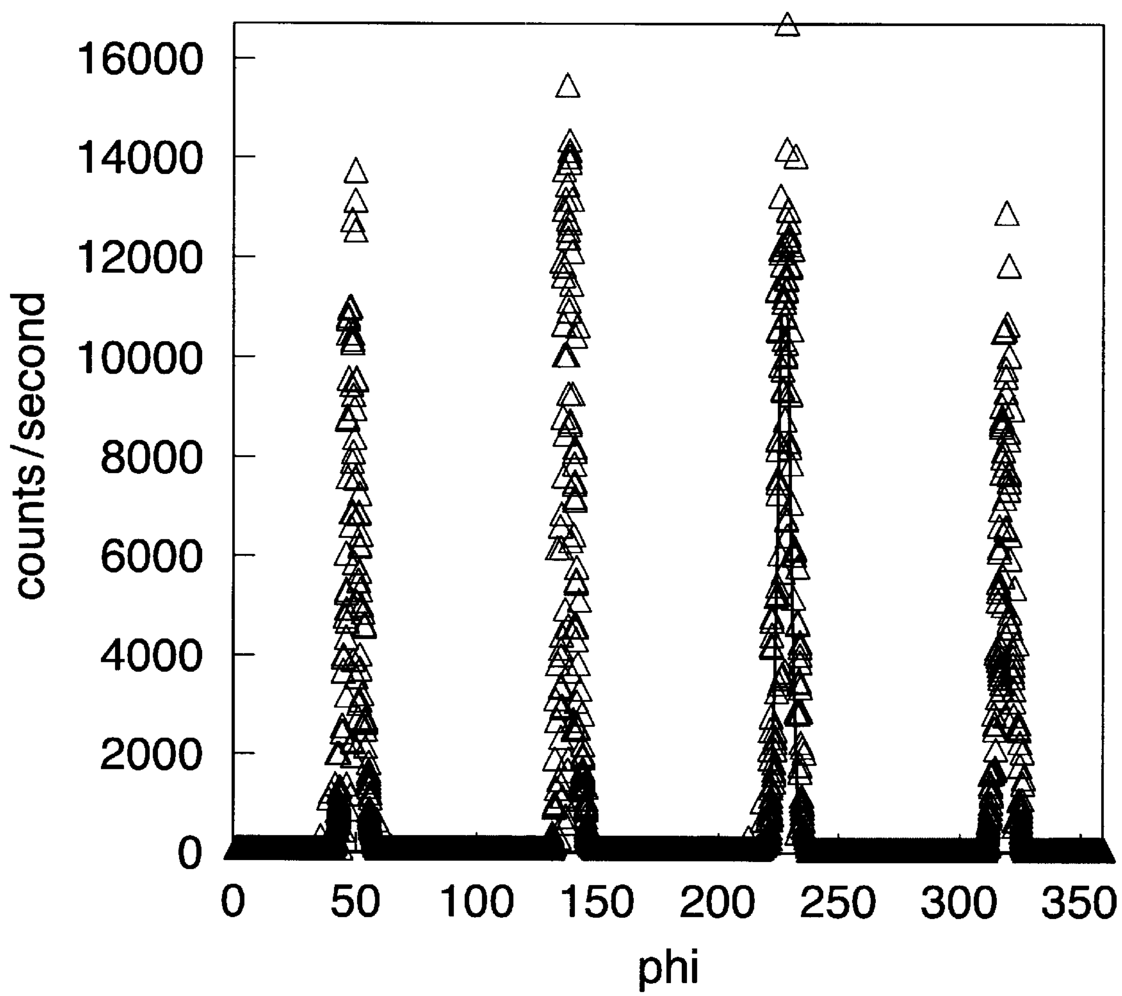
FIG. 26 shows a phi ($\phi$) scan of the [111] reflection, with $\phi$ varying from 0° to 360°, for a Ni-9 at %W-0.03 at %Mg alloy fabricated by rolling and annealing a compacted and sintered, powder metallurgy preform. The presence of four peaks is with only a well-developed {100}<100>, biaxial cube texture is apparent. The final annealing temperature of the sample was 1400° C. The FWHM of the $\phi$-scan, as determined by fitting a gaussian curve to one of the peaks is ~6.1°. The FWHM of the peaks in this scan is indicative of the in-plane texture of the grains in the sample.
Figure 27:
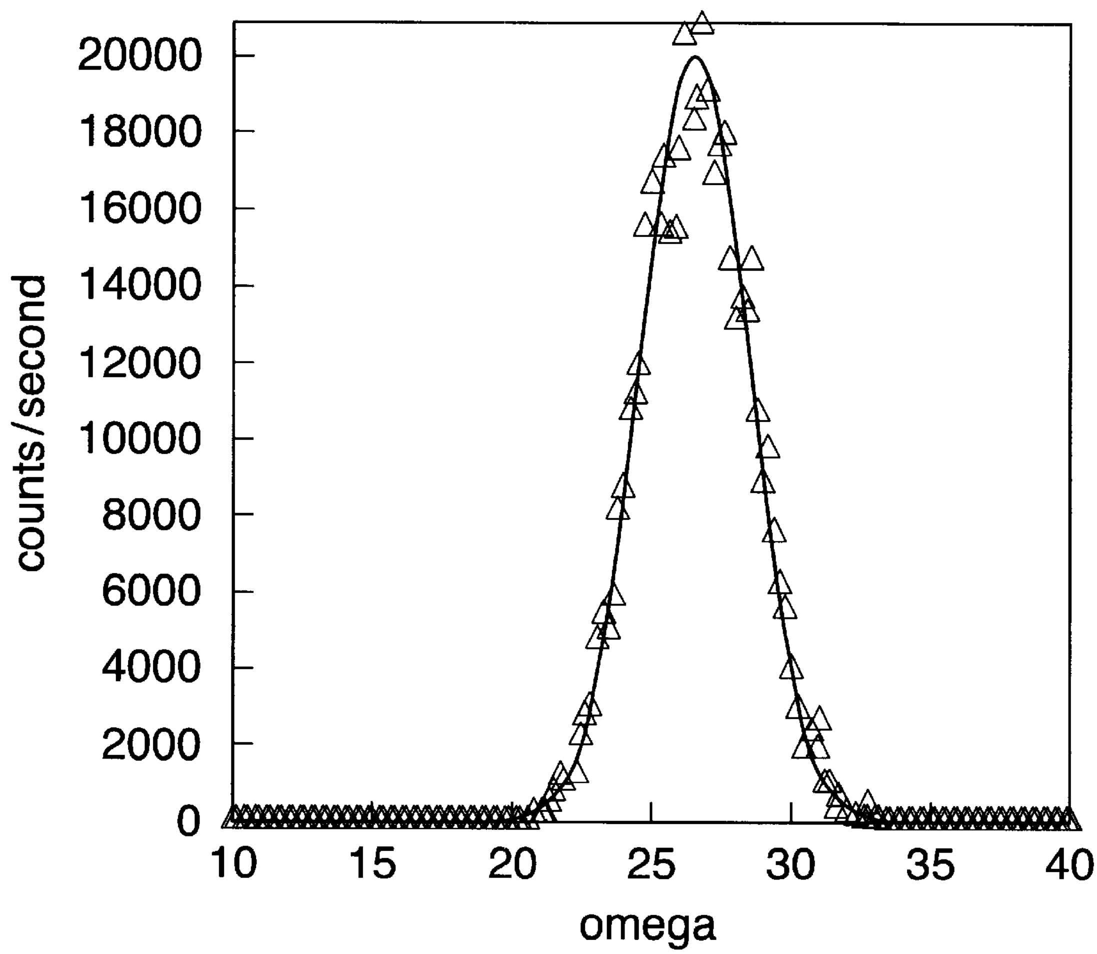
FIG. 27 shows a rocking curve ($\omega$-scan) from 10° to 40° with the sample being rocked in the rolling direction, for a Ni-9 at %W-0.03 at %Mg alloy fabricated by rolling and annealing a compacted and sintered, powder metallurgy preform. The final annealing temperature of the sample was 1400° C. The peak is indicative of the out-of-plane texture of the sample. The FWHM of the $\omega$-scan, as determined by fitting a gaussian curve to one of the peaks is ~6.7°.
Figure 28:
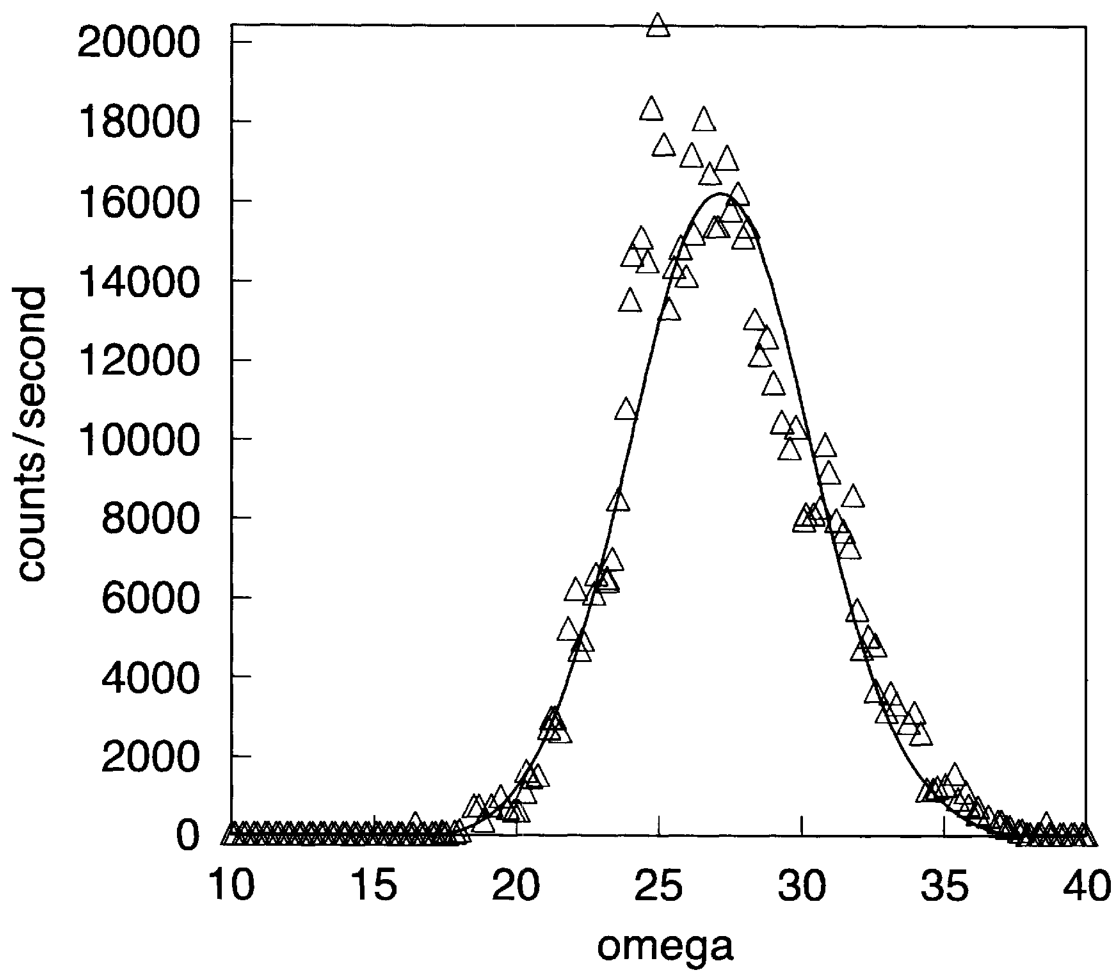
FIG. 28 shows a rocking, curve ($\omega$-scan) from 10° to 40° with the sample being rocked about the rolling direction, for a Ni-9 at %W-0.03 at %Mg alloy fabricated by rolling and annealing a compacted and sintered, powder metallurgy preform. The final annealing temperature of the sample was 1400° C. The peak is indicative of the out-of-plane texture of the sample. The FWHM of the $\omega$-scan, as determined by fitting a gaussian curve to one of the peaks is ~7.5°.

FIG. 25 shows a (111) X-ray diffraction pole figure of the biaxially textured alloy substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 26 shows a phi-scan of the [111] reflection showing the degree of in-plane texture. The FWHM of the tape is determined by fitting a gaussian curve to the data is ~6.1°. FIG. 27 shows the rocking curve or the out-of-plane texture as measured by scanning the [200] reflection of the substrate. FIG. 27 is a rocking curve with the sample being rocked in the rolling direction and shows a FWHM of 6.7°. FIG. 28 is a rocking curve with the sample being rocked about the rolling direction and shows a FWHM of 7.5°. This is truly a single orientation texture with all crystallographic axis being aligned in all direction within 6–7°. Alloy substrates made by procedures other than what is described above undergo secondary recrystallization at such annealing temperatures and lose most of their biaxial texture. On the contrary, the substrates reported here, improve their biaxial textures upon annealing at temperatures as high as 1400° C.

Example VIII

Begin with a mixture of 0.03 at % Mg, 13 at %Cr and remaining Ni powder. Mix and compact at appropriate pressures into a rod or billet. Then heat treat at 900° C. for 2 hr. During this thermomechanical processing all the Mg is converted to MgO and it is dispersed in a fine and homogeneous manner throghout the preform. The grain size at the end of heat treatment is less than 50 μm. Deform, by rolling, to a degree greater than 90% total deformation, preferably using 10% reduction per pass and by reversing the rolling direction during each subsequent pass. Anneal at about 1200° C. for about 60 minutes to produce a sharp biaxial texture. Annealing is performed in flowing 4% $H_2$ in Ar.

Figure 29:
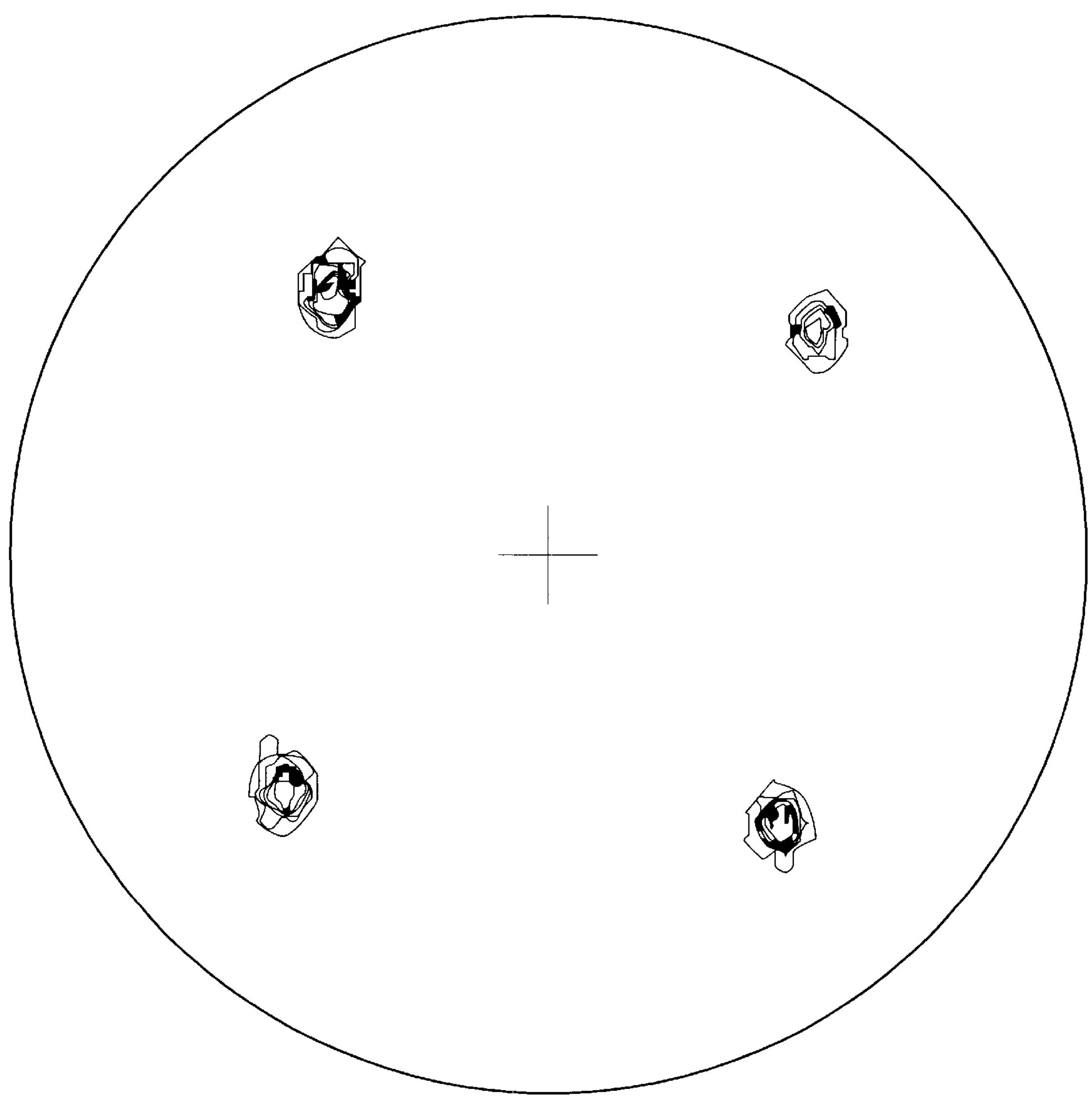
FIG. 29 shows a (111) pole figure for a Ni-13 at %Cr-0.03 at %Mg alloy fabricated by rolling and annealing a compacted and sintered, powder metallurgy preform. The Mg is predominantly expected to be present as MgO. The pole figure indicates only four peaks consistent with only a well-developed {100}<100>, biaxial cube texture. The final annealing temperature of the sample was 1200° C.
Figure 30:
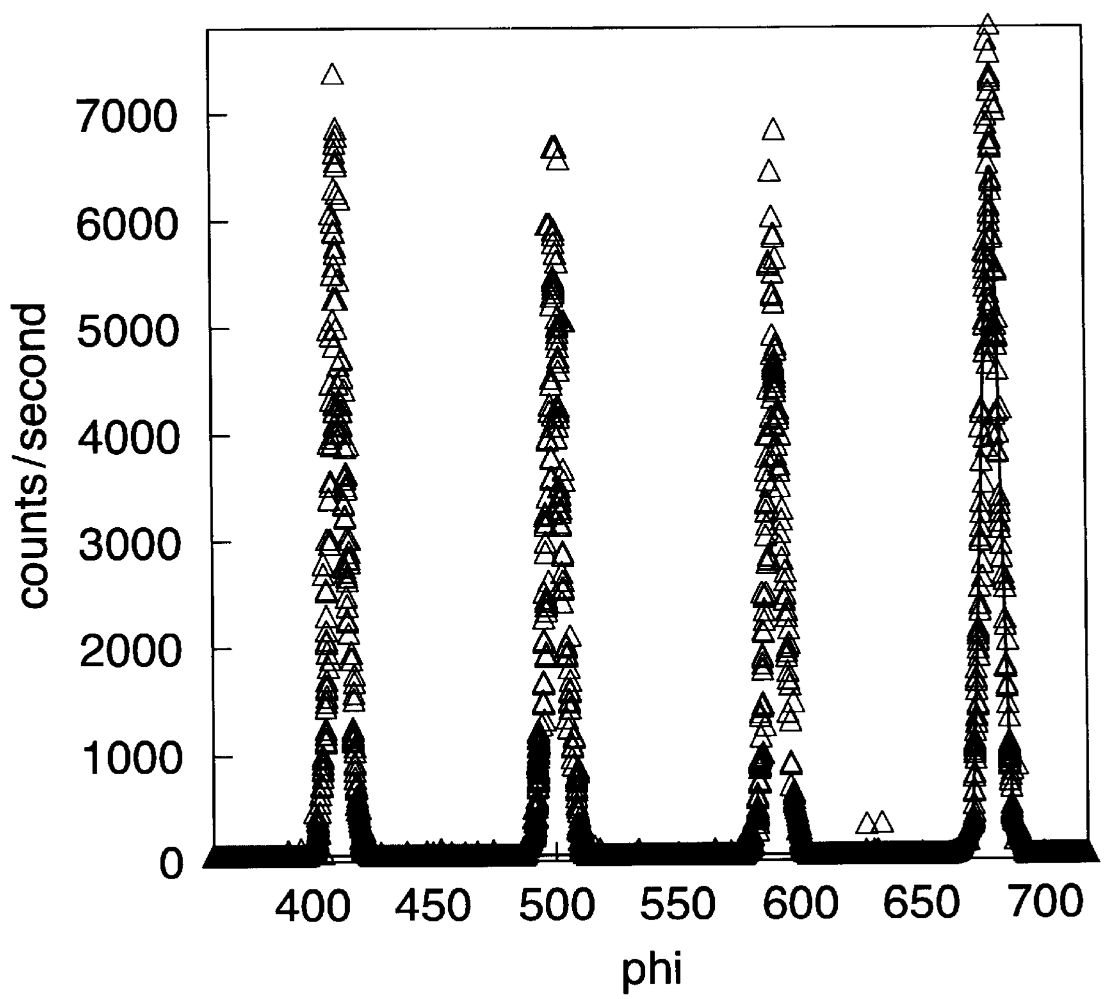
FIG. 30 shows a phi ($\phi$) scan of the [111] reflection, with $\phi$ varying from 0° to 360°, for a Ni-13 at %Cr-0.03 at %Mg alloy fabricated by rolling and annealing a compacted and sintered, powder metallurgy preform. The presence of four-peaks with only a well-developed {100}<100>, biaxial cube texture is apparent. The final annealing temperature of the sample was 1200° C. The FWHM of the $\phi$-scan, as determined by fitting a gaussian curve to one of the peaks is ~8.1°. The FWHM of the peaks in this scan is indicative of the in-plane texture of the grains in the sample.
Figure 31:
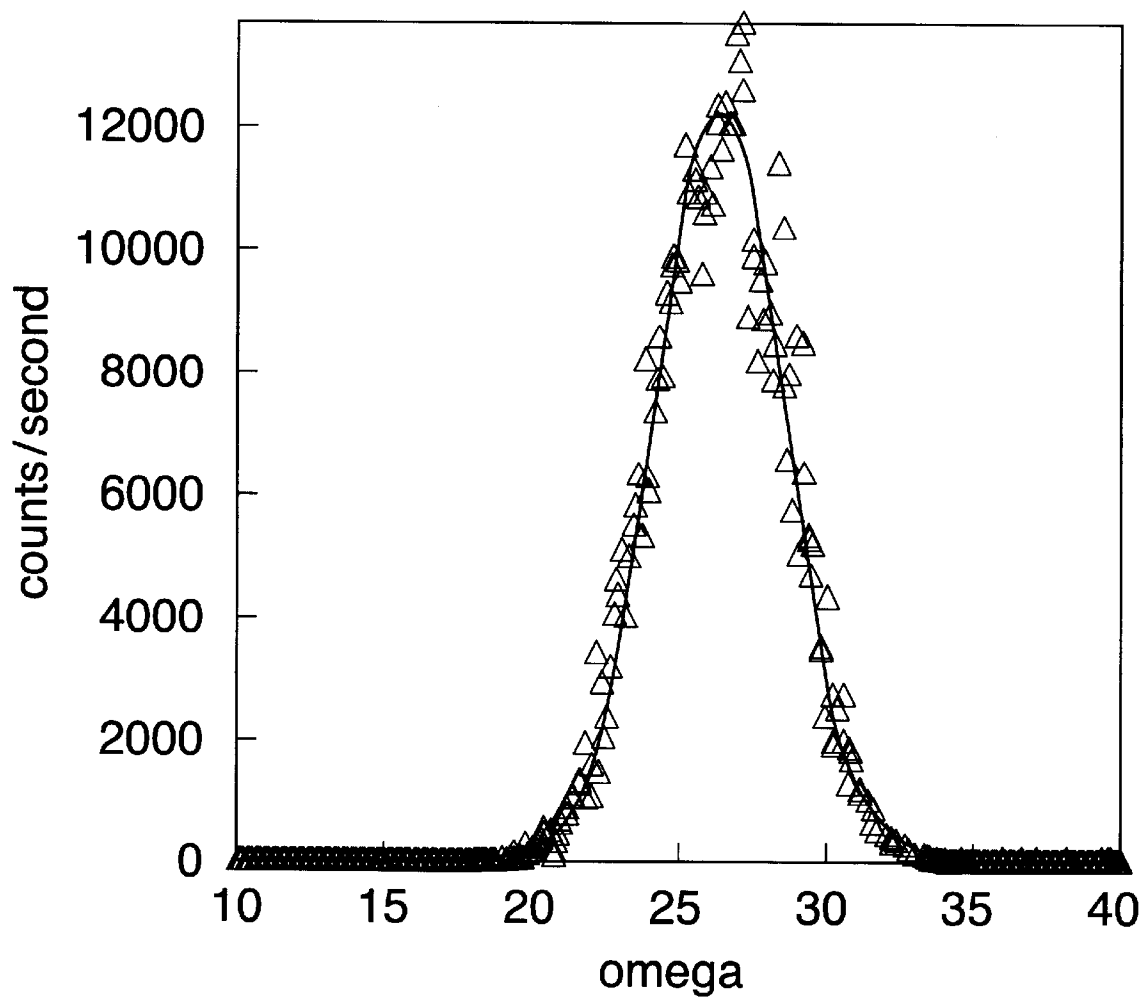
FIG. 31 shows a rocking curve ($\omega$-scan) from 10° to 40° with the sample being rocked in the rolling direction, for a Ni-13 at %Cr-0.03 at %Mg, alloy fabricated by rolling and annealing a compacted and sintered, powder metallurgy preform. The final annealing temperature of the sample was 1200° C. The peak is indicative of the out-of-plane texture of the sample. The FWHM of the $\omega$-scan, as determined by fitting a gaussian curve to one of the peaks is ~5.1°.
Figure 32:
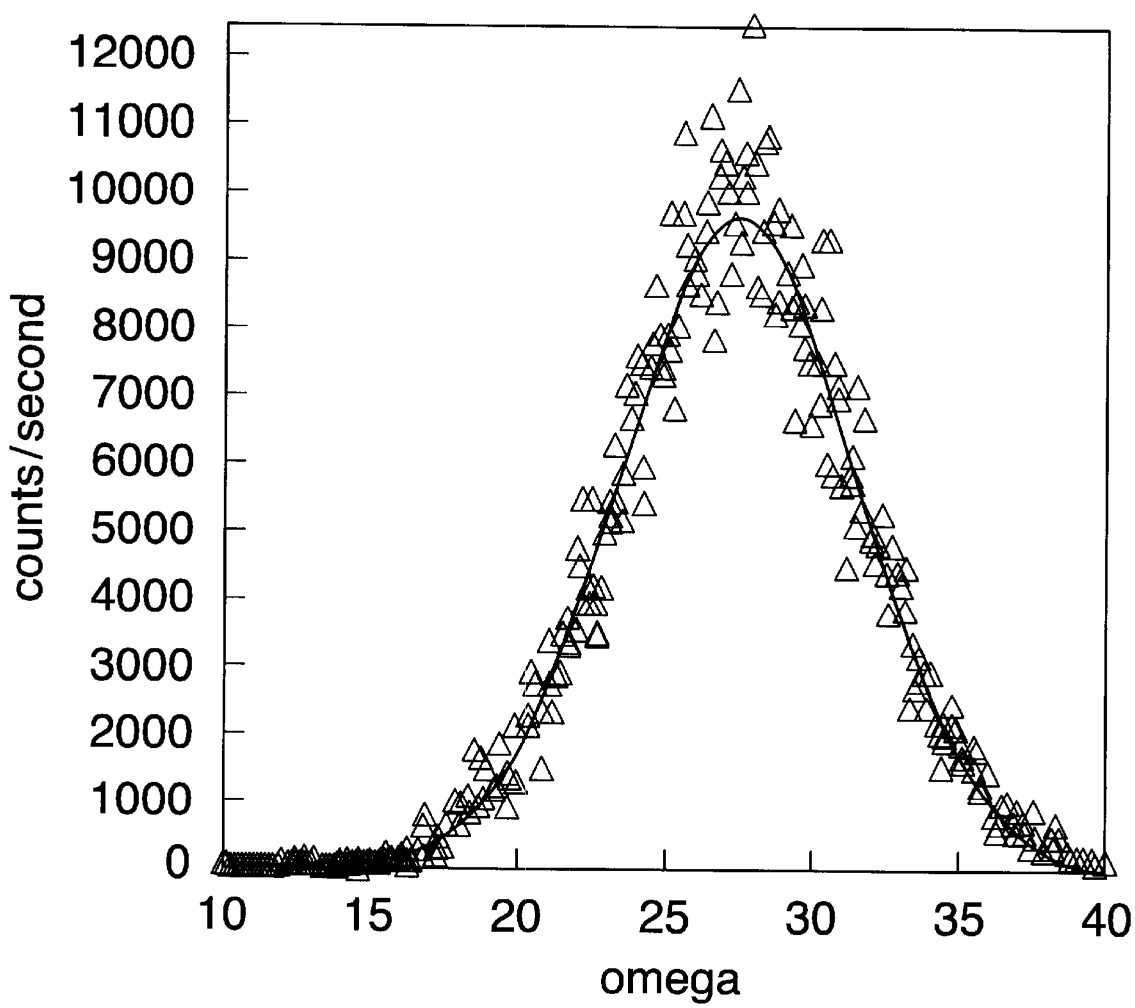
FIG. 32 shows a rocking curve ($\omega$-scan) from 10° to 40° with the sample being rocked about the rolling direction, for a Ni-13 at %Cr-0.03 at %Mg alloy fabricated by rolling and annealing a compacted and sintered, powder metallurgy preform. The final annealing temperature of the sample was 1200° C. The peak is indicative of the out-of-plane texture of the sample. The FWHM of the $\omega$-scan, as determined by fitting a gaussian curve to one of the peaks is ~9.5°.

FIG. 29 shows a (111) X-ray diffraction pole figure of the biaxially textured, particulate, composite substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 30 shows a phi-scan of the [111] reflection showing the degree of in-plane texture. The FWHM of the tape determined by fitting a gaussian curve to the data is ~8.06°. FIG. 31 shows the rocking curve or the out-of-plane texture as measured by scanning the [200] reflection of the substrate. FIG. 31 is a rocking curve with the sample being rocked in the rolling direction and shows a FWHM of 5.1°. FIG. 32 is a rocking curve with the sample being rocked about the rolling direction and shows a FWHM of 9.47°. This is truly a single orientation texture with all crystallographic axis being aligned in all directions within 8–10°. Begin with a mixture of 0.03 at % Mg, 9 at %W and remaining Ni powder (99.99% purity). Mix and compact at appropriate pressures into a rod or billet. Then heat treat at 900° C. for 2 hr. During this thermomechanical processing all the Mg is converted to MgO and it is dispersed in a fine and homogeneous manner throughout the preform. The grain size at the end of heat treatment is less than 50 μm. Deform, by rolling, to a degree greater than 90% total deformation, preferably using 10% reduction per pass and by reversing the rolling direction during each subsequent pass. Anneal at about 1400° C. for about 60 minutes to produce a sharp biaxial texture. Annealing is performed in flowing 4% $H_2$ in Ar.

Example IX

Begin with a mixture of 0.03 at % Mg, 13 at %Cr and remaining Ni powder (99.99% purity). Mix and compact at appropriate pressures into a rod or billet. Then heat treat at 900° C. for 2 hr. During this thermomechanical processing all the Mg is converted to MgO and it is dispersed in a fine and homogeneous manner throughout the preform. The grain size at the end of heat treatment is less than 50 $\mu$m. Deform, by rolling to a degree greater than 90% total deformation, preferably using 10% reduction per pass and by reversing the rolling direction during each subsequent pass. Anneal at about 1400° C. for about 60 minutes to produce a sharp biaxial texture. Annealing is performed in flowing 4% $H_2$ in Ar.

Figure 33:
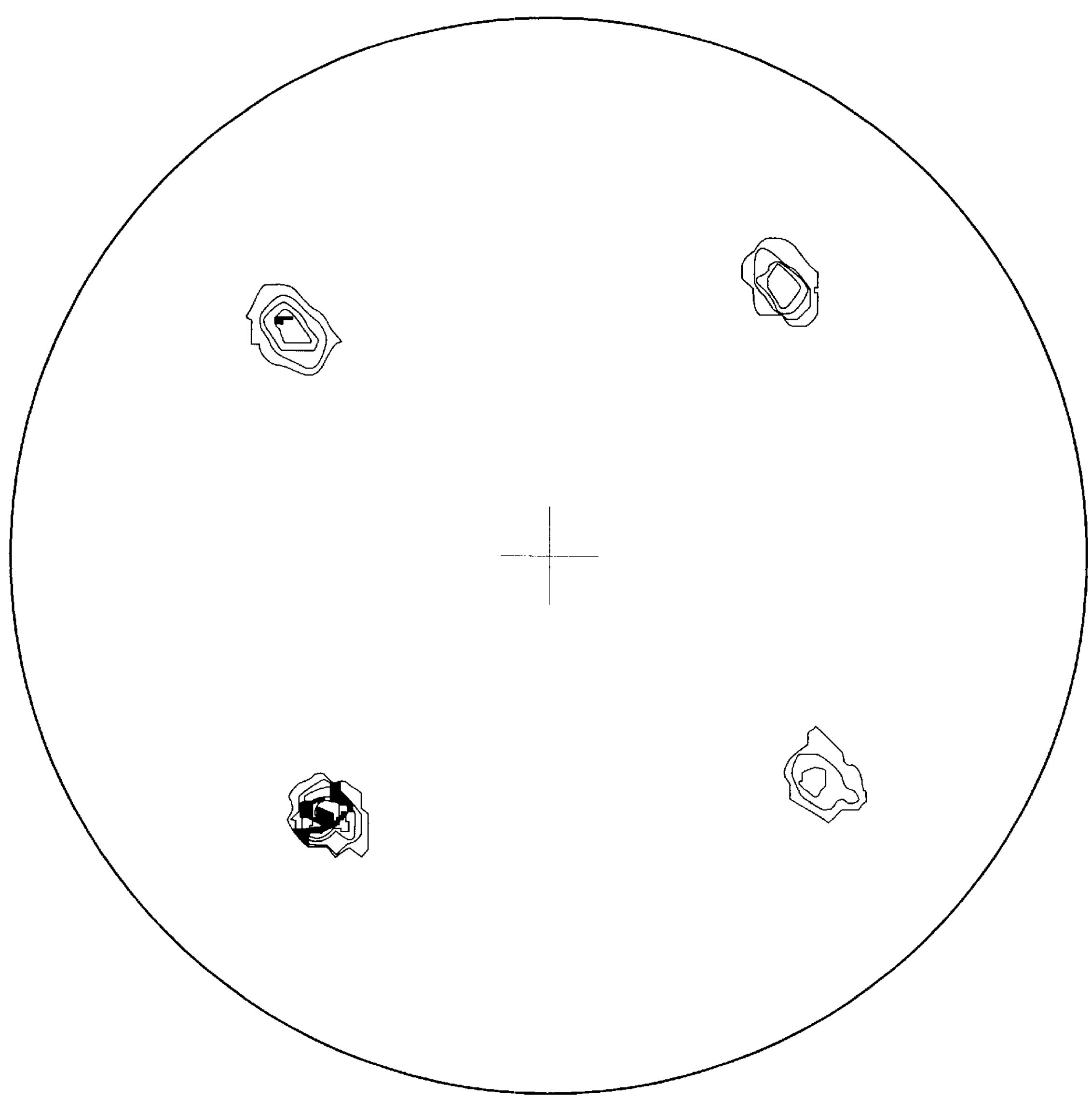
FIG. 33 shows a (111) pole figure for a Ni-13 at %Cr-0.03 at %Mg alloy fabricated by rolling and annealing a compacted and sintered, powder metallurgy preform. The Mg is predominantly expected to be present as MgO. The pole figure indicates only four peaks consistent with only a well-developed {100}<100>, biaxial cube texture. The final annealing temperature of the sample was 1400° C.
Figure 34:
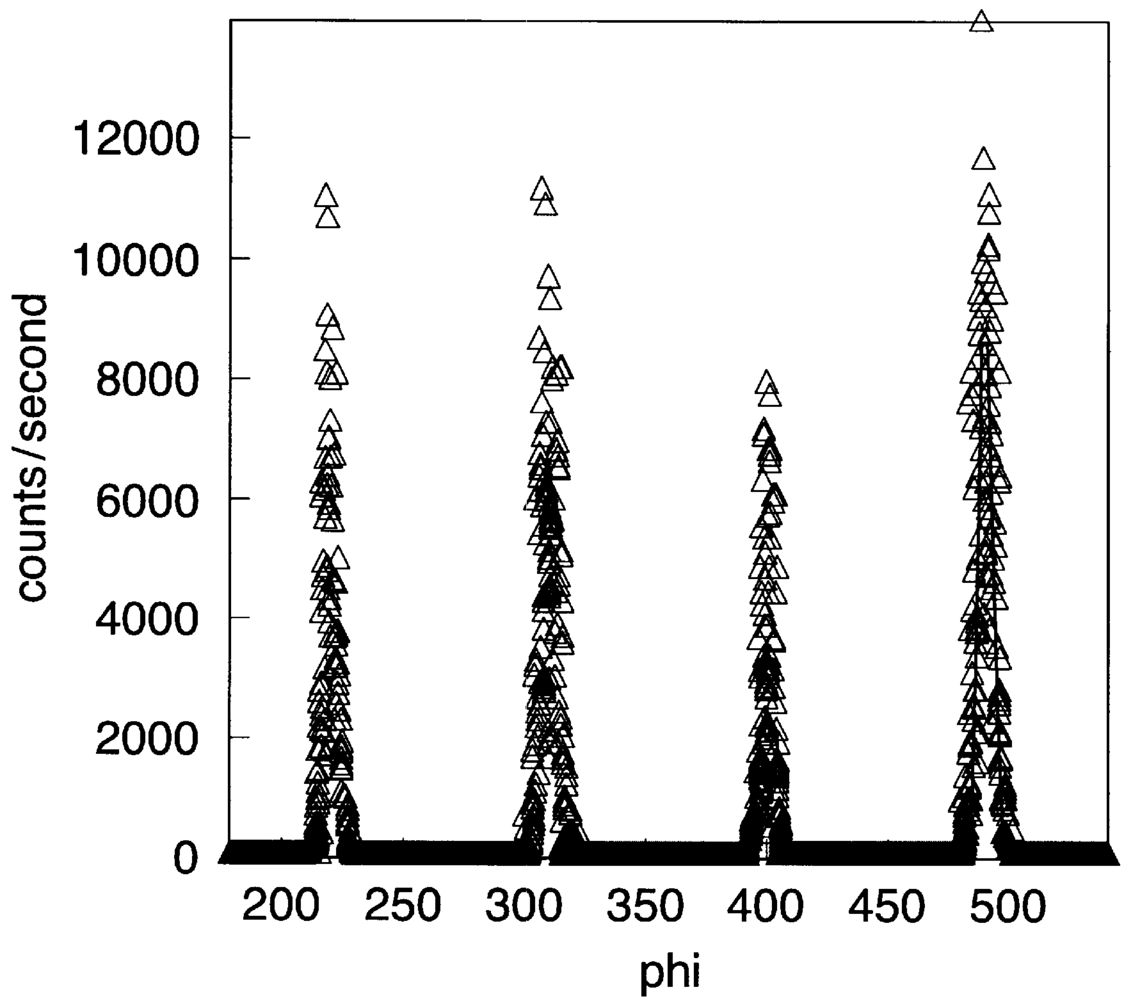
FIG. 34 shows a phi ($\phi$) scan of the [111] reflection, with $\phi$ varying from 0° to 360°, for a Ni-13 at %Cr-0.03 at %Mg alloy fabricated by rolling and annealing a compacted and sintered, powder metallurgy preform. The presence of four-peaks is with only a well-developed {100}<100>, biaxial cube texture is apparent. The final annealing temperature of the sample was 1400° C. The FWHM of the $\phi$-scan, as determined by fitting a gaussian curve to one of the peaks is ~6.5°. The FWHM of the peaks in this scan is indicative of the in-plane texture of the grains in the sample.
Figure 35:
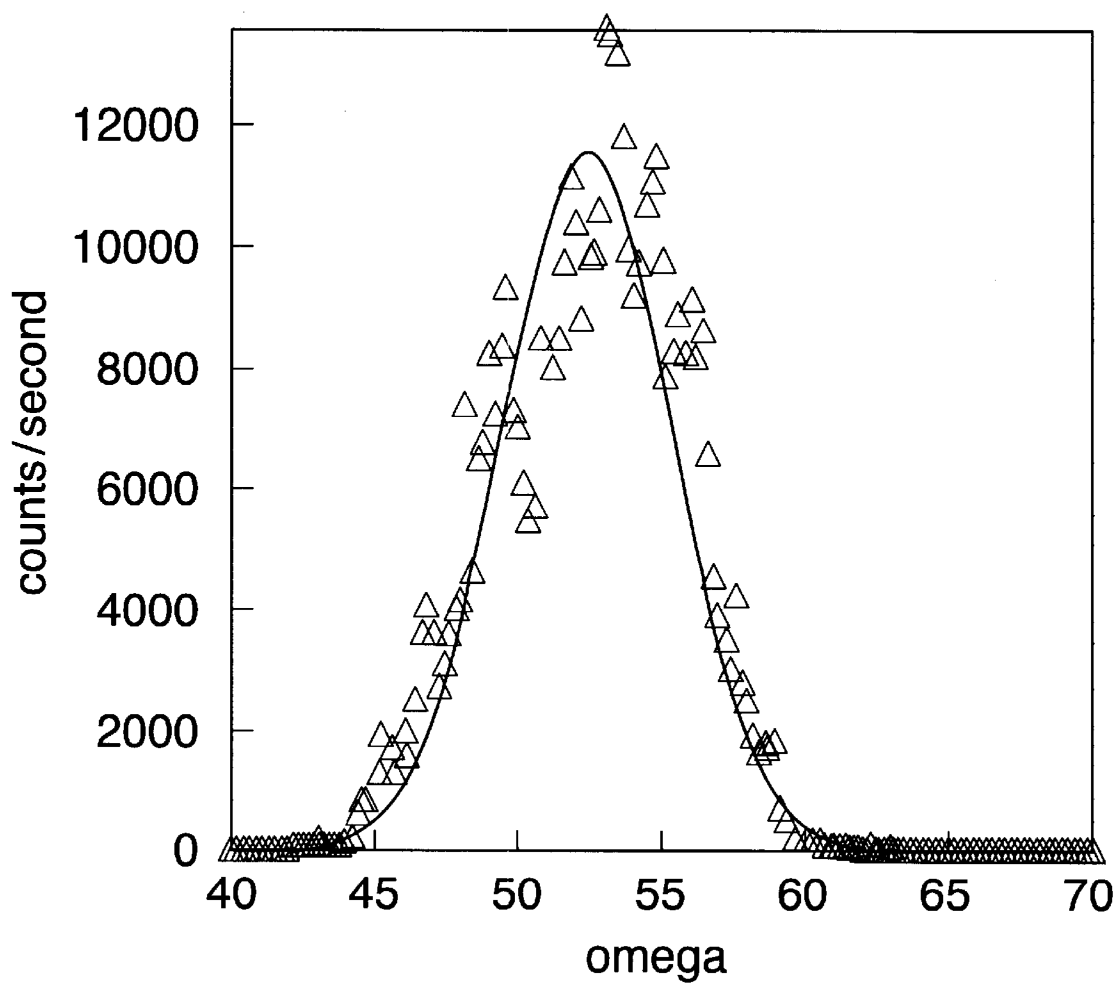
FIG. 35 shows a rocking curve ($\omega$-scan) from 10° to 40° with the sample being rocked in the rolling direction, for a Ni-13 at %Cr-0.03 at %Mg alloy fabricated by rolling and annealing a compacted and sintered, powder metallurgy preform. The final annealing temperature of the sample was 1400° C. The peak is indicative of the out-of-plane texture of the sample. The FWHM of the $\omega$-scan, as determined by fitting a gaussian curve to one of the peaks is ~6.9°.
Figure 36:
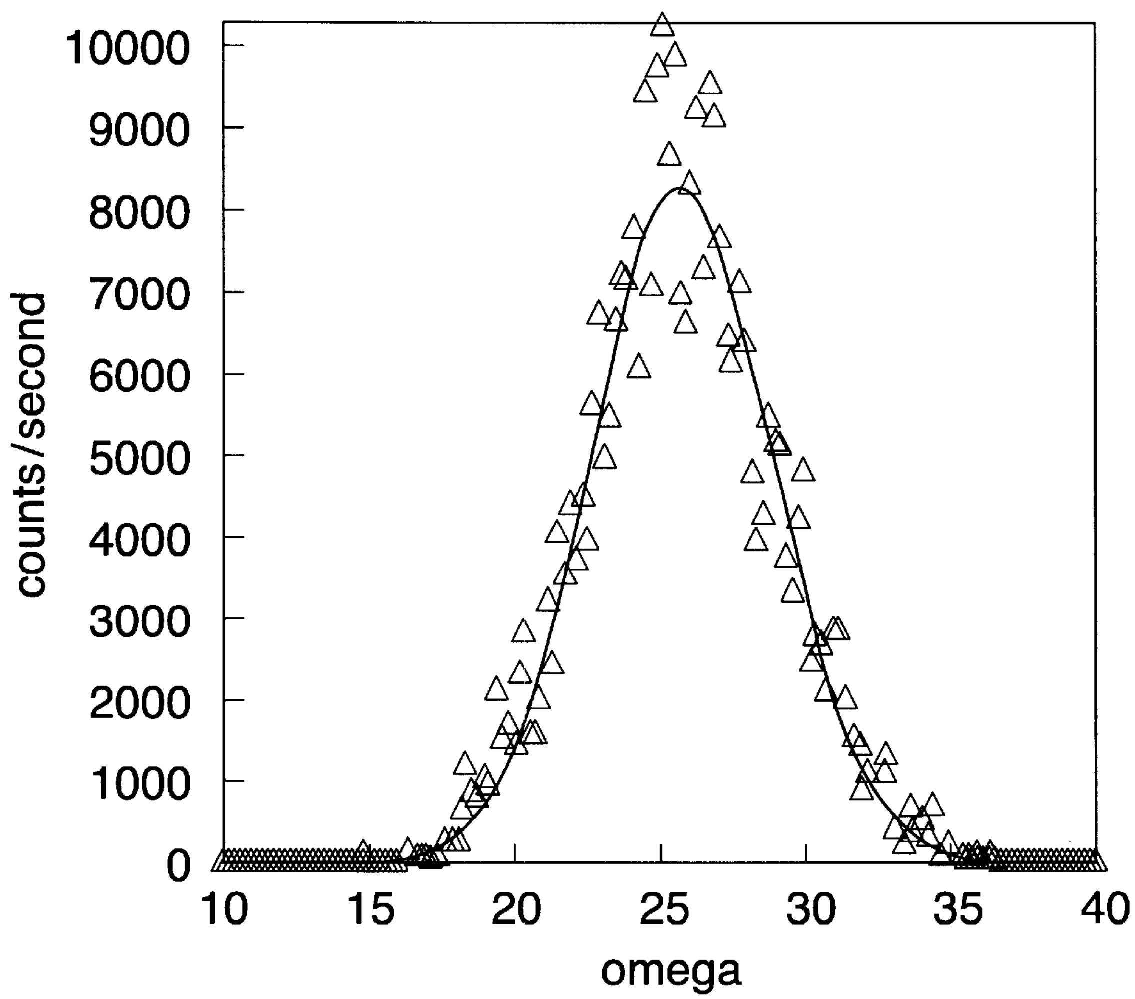
FIG. 36 shows a rocking curve ($\omega$-scan) from 10° to 40° with the sample being rocked about the rolling direction, for a Ni-13 at %Cr-0.03 at %Mg alloy fabricated by rolling and annealing a compacted and sintered, powder metallurgy preform. The final annealing temperature of the sample was 1400° C. The peak is indicative of the out-of-plane texture of the sample. The FWHM of the $\omega$-scan, as determined by fitting a gaussian curve to one of the peaks is ~7.9°.

FIG. 33 shows a (111) X-ray diffraction pole figure of the biaxially textured alloy substrate. As can be seen, only four peaks are evident. Each peak refers to one of four crystallographically similar orientations corresponding to {100}<100>, such that the (100) plane is parallel to the surface of the tape and <100> direction is aligned along the long axis of the tape. FIG. 34 shows a phi-scan of the [111] reflection showing the degree of in-plane texture. The FWHM of the tape is determined by fitting a gaussian curve to the data is ~6.5°. FIG. 35 shows the rocking curve or the out-of-plane texture as measured by scanning the [200] reflection of the substrate. FIG. 35 is a rocking, curve with the sample being rocked in the rolling direction and shows a FWHM of 6.9°. FIG. 36 is a rocking curve with the sample being rocked about the rolling direction and shows a FWHM of 7.9°. This is truly a single orientation texture with all crystallographic axis being aligned in all direction within 6–8°. Alloy substrates made by procedures other than what is described above undergo secondary recrystallization at such annealing temperatures and lose most of their biaxial texture. On the contrary, the substrates reported here, improve their biaxial textures Upon annealing at temperatures as high as 1400° C.

Example X

Begin with 99.99% pure Ni powder, and mix in fine (nanocrystalline or microcrystalline) oxide powders such as $CeO_2$, $Y_2O_3$, and the like. Mix homogeneously and compact to a monolithic form. Deform, preferably by reverse rolling to a degree of deformation greater than 90%. Heat treat at temperatures above the primary recrystallization temperature but below the secondary recrystallization temperature to obtain a sharp biaxially textured substrate.

Similar experiments with additions of a dispersion and at least one fine metal oxide powder such as but not limited to $Al_2O_3$, MgO, YSZ, $CeO_2$, $Y_2O_3$, YSZ, and $RE_2O_3$; etc. can be performed with binary alloys of Ni—Cu, Ni—V, Ni—Mo, Ni—Al, and with tertiary alloys of Ni—Cr—Al, Ni—W—Al, Ni—V—Al, Ni—Mo—Al, Ni—Cu—Al. Similar results are also expected for 100% Ag and Ag alloys such Ag—Cu, Ag—Pd.

PROCEDURES AND EXAMPLES TO OBTAIN AND EFFECTIVELY USE BIAXIALLY TEXTURED ALLOYS WHICH HAVE STACKING FAULT FREQUENCIES GREATER THAN 0.009 AT ROOM TEMPERATURE

In all the following examples, begin with separate powders of the constituents required to form the alloy, mixing them thoroughly and compacting them preferably into the form or a rod or billet. The rod or billet is then deformed, preferably by rolling, at about room temperature or a higher temperature provided the higher temperature is low enough that negligible inter-diffusion of elements occurs. During the initial stages of deformation the larger metal constituent essentially forms a connected and mechanically bonded network. The rod or billet is now rolled to a large degree of deformation, preferably greater than 90%. The alloying element powders remain as discrete particles in the matrix and may not undergo any significant deformation. Once the deformation is complete, rapidly thermally re-crystallize the substrate to texture the matrix material. The alloying elements can be diffused in at a higher temperature after the texture is attained in the matrix.

Example XI

Begin with 80% Ni and 20% Cr powder. Mix homogeneously and compact to a monolithic form. Heat-treat to low temperatures so as to bond Ni—Ni particles. Since Cr particles are completely surrounded by Ni, their sintering or bonding to the Ni particles is not critical. Deform, preferably by reverse rolling to a degree of deformation greater than 90%. In such a case, the final substrate does not have a homogeneous chemical composition. There are clearly Cr particles dispersed in the matrix. The substrate is now rapidly heated in a furnace to a temperature between the primary and secondary recrystallization of Ni. The objective is to obtain a cube texture in the Ni matrix, with local regions of high Cr concentrations. The aim of the heat treatment is to minimize diffusion of Cr into the Ni matrix. Once the cube texture has been obtained, desired epitaxial oxide, nitride or other buffer layers are deposited on the substrate. Once the first layer is deposited, the substrate can be heat treated at higher temperatures to affect diffusion of Cr into Ni. While high concentrations of Cr of 20 at % in the substrate would result in appearance of secondary texture components, it does not matter at this point what the texture of the underlying metal below the textured ceramic buffer layer is, since further epitaxy is going to occur at the surface of the first ceramic layer.

Similar experiments can be performed with binary alloys of Ni—Cu, Ni—V, Ni—Mo, Ni—Al, and with ternary alloys of Ni—Cr—Al, Ni—W—Al, Ni—V—Al, Ni—Mo—Al, Ni—Cu—Al. Similar results are also expected for 100% Ag and Ag alloys such Ag—Cu, Ag—Pd.

Similar experiments can also be performed with additions of a dispersion of at least one fine metal oxide powder such as but not limited to $Al_2O_3$, MgO, YSZ, $CeO_2$, $Y_2O_3$, YSZ, and $RE_2O_3$; etc. with binary alloys of Ni—Cu, Ni—V, Ni—Mo, Ni—Al, and with ternary alloys of Ni—CrAl, Ni—W—Al, Ni—V—Al, Ni—Mo—Al, Ni—Cu—Al. Similar results are also expected for 100% Ag and Ag alloys such Ag—Cu, Ag—Pd.

While there has been shown and described what are at present considered the preferred embodiments of the invention, it will be obvious to those skilled in the art that various changes and modifications can be made therein without departing from the scope of the inventions defined by the appended claims.

What is claimed is:

1. A biaxially textured alloy article having a magnetism less than pure Ni comprising a rolled and annealed compacted and sintered powder-metallurgy preform article, the preform article having been formed from a powder mixture selected from the group of mixtures consisting of: at least 60 at % Ni powder and at least one of Cr powder, W powder, V powder, Mo powder, Cu powder, Al powder, Ce powder, YSZ powder, Y powder, Mg powder, and RE powder; the article having a fine and homogeneous grain structure; and having a dominant cube oriented {100}<100> orientation texture; and further having a Curie temperature less than that of pure Ni.

2. The biaxially textured article of claim 1 wherein the article maintains its {100}<100> texture at annealing temperatures up to 1200° C.

3. The biaxially textured article of claim 1 wherein the article maintains its {100}<100> texture at annealing temperatures up to 1300° C.

4. The biaxially textured article of claim 1 wherein the article maintains its {100}<100> texture at annealing temperatures up to 1400° C.

* * * * *